(12) United States Patent
Ahn et al.

(10) Patent No.: US 8,581,352 B2
(45) Date of Patent: Nov. 12, 2013

(54) ELECTRONIC DEVICES INCLUDING BARIUM STRONTIUM TITANIUM OXIDE FILMS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/550,971

(22) Filed: Aug. 31, 2009

(65) Prior Publication Data

US 2009/0315089 A1    Dec. 24, 2009

Related U.S. Application Data

(62) Division of application No. 11/510,803, filed on Aug. 25, 2006, now Pat. No. 7,582,549.

(51) Int. Cl.
*H01L 29/51* (2006.01)

(52) U.S. Cl.
USPC .................................. 257/411; 257/E29.165

(58) Field of Classification Search
None
See application file for complete search history.

(56) References Cited

U.S. PATENT DOCUMENTS

| | | | |
|---|---|---|---|
| 1,556,415 A | 10/1925 | Calwell | |
| 2,637,961 A | 5/1953 | Sutton | |
| 3,108,161 A | 10/1963 | Tourtellot | |
| 5,635,741 A | 6/1997 | Tsu et al. | |
| 5,731,220 A * | 3/1998 | Tsu et al. | 438/782 |
| 5,972,430 A | 10/1999 | DiMeo, Jr. et al. | |
| 6,144,060 A | 11/2000 | Park et al. | |
| 6,203,613 B1 | 3/2001 | Gates et al. | |
| 6,271,094 B1 | 8/2001 | Boyd et al. | |
| 6,287,965 B1 | 9/2001 | Kang et al. | |
| 6,319,542 B1 * | 11/2001 | Summerfelt et al. | 427/79 |
| 6,380,579 B1 | 4/2002 | Nam et al. | |
| 6,395,650 B1 | 5/2002 | Callegari et al. | |
| 6,407,435 B1 | 6/2002 | Ma et al. | |
| 6,420,230 B1 | 7/2002 | Derderian et al. | |
| 6,426,307 B2 | 7/2002 | Lim | |
| 6,445,030 B1 | 9/2002 | Wu et al. | |
| 6,461,914 B1 | 10/2002 | Roberts et al. | |
| 6,492,283 B2 | 12/2002 | Raaijmakers et al. | |
| 6,495,436 B2 | 12/2002 | Ahn et al. | |

(Continued)

FOREIGN PATENT DOCUMENTS

| | | |
|---|---|---|
| EP | 0812021 A2 | 12/1997 |
| TW | 511232 | 11/2002 |
| WO | WO-03003065 | 1/2003 |
| WO | WO-2008027197 A1 | 3/2008 |

OTHER PUBLICATIONS

International Application No. PCT/US2007/018137, Search Report, dated Jan. 25, 2008, 4 pgs.

(Continued)

*Primary Examiner* — Benjamin Sandvik
(74) *Attorney, Agent, or Firm* — Schwegman, Lundberg & Woessner, P.A.

(57) ABSTRACT

Apparatus and methods of forming the apparatus include a dielectric layer containing barium strontium titanium oxide layer, an erbium-doped barium strontium titanium oxide layer, or a combination thereof. Embodiments of methods of fabricating such dielectric layers provide dielectric layers for use in a variety of devices. Embodiments include forming barium strontium titanium oxide film using atomic layer deposition. Embodiments include forming erbium-doped barium strontium titanium oxide film using atomic layer deposition.

25 Claims, 4 Drawing Sheets

(56) References Cited

U.S. PATENT DOCUMENTS

| | | | |
|---|---|---|---|
| 6,501,121 B1 * | 12/2002 | Yu et al. ........................ 257/310 |
| 6,509,601 B1 | 1/2003 | Lee et al. |
| 6,509,612 B2 | 1/2003 | Clevenger et al. |
| 6,514,828 B2 | 2/2003 | Ahn et al. |
| 6,534,420 B2 | 3/2003 | Ahn et al. |
| 6,537,862 B2 | 3/2003 | Song |
| 6,579,755 B2 | 6/2003 | Kim et al. |
| 6,590,251 B2 | 7/2003 | Kang et al. |
| 6,605,549 B2 | 8/2003 | Leu et al. |
| 6,608,378 B2 | 8/2003 | Ahn et al. |
| 6,613,695 B2 | 9/2003 | Pomarede et al. |
| 6,617,209 B1 | 9/2003 | Chau et al. |
| 6,621,114 B1 | 9/2003 | Kim et al. |
| 6,627,503 B2 | 9/2003 | Ma et al. |
| 6,634,314 B2 | 10/2003 | Hwang et al. |
| 6,645,805 B2 | 11/2003 | Kil |
| 6,656,835 B2 | 12/2003 | Marsh et al. |
| 6,660,597 B2 | 12/2003 | Furukawa et al. |
| 6,660,660 B2 | 12/2003 | Haukka et al. |
| 6,661,058 B2 | 12/2003 | Ahn et al. |
| 6,664,168 B1 | 12/2003 | Andideh et al. |
| 6,664,578 B2 | 12/2003 | Lee et al. |
| 6,667,209 B2 | 12/2003 | Won et al. |
| 6,673,701 B1 | 1/2004 | Marsh et al. |
| 6,689,623 B2 | 2/2004 | Hong |
| 6,696,332 B2 | 2/2004 | Visokay et al. |
| 6,699,725 B2 | 3/2004 | Lee |
| 6,709,911 B1 | 3/2004 | Doczy et al. |
| 6,713,358 B1 | 3/2004 | Chau et al. |
| 6,716,695 B1 | 4/2004 | Hattangady et al. |
| 6,717,197 B2 | 4/2004 | An |
| 6,720,259 B2 | 4/2004 | Londergan et al. |
| 6,730,163 B2 | 5/2004 | Vaartstra |
| 6,730,164 B2 | 5/2004 | Vaartstra et al. |
| 6,743,933 B2 | 6/2004 | Onozawa et al. |
| 6,750,066 B1 | 6/2004 | Cheung et al. |
| 6,756,261 B2 | 6/2004 | Hong et al. |
| 6,765,255 B2 | 7/2004 | Jin et al. |
| 6,767,795 B2 | 7/2004 | Ahn et al. |
| 6,769,629 B2 | 8/2004 | Hwang et al. |
| 6,773,507 B2 | 8/2004 | Jallepally et al. |
| 6,777,305 B2 | 8/2004 | Lee et al. |
| 6,784,049 B2 | 8/2004 | Vaartstra |
| 6,784,101 B1 | 8/2004 | Yu et al. |
| 6,787,413 B2 | 9/2004 | Ahn |
| 6,794,284 B2 | 9/2004 | Vaartstra |
| 6,794,314 B2 | 9/2004 | Raaijmakers et al. |
| 6,798,010 B2 | 9/2004 | Lee |
| 6,800,542 B2 | 10/2004 | Kim |
| 6,800,567 B2 | 10/2004 | Cho |
| 6,803,275 B1 | 10/2004 | Park et al. |
| 6,806,139 B2 | 10/2004 | Kim et al. |
| 6,815,221 B2 | 11/2004 | Kim et al. |
| 6,815,226 B2 | 11/2004 | Lee et al. |
| 6,815,227 B2 | 11/2004 | An |
| 6,818,517 B1 | 11/2004 | Maes |
| 6,818,935 B2 | 11/2004 | Kweon et al. |
| 6,824,816 B2 | 11/2004 | Aaltonen et al. |
| 6,825,129 B2 | 11/2004 | Hong |
| 6,830,983 B2 | 12/2004 | Marsh |
| 6,844,203 B2 | 1/2005 | Ahn et al. |
| 6,844,604 B2 | 1/2005 | Lee et al. |
| 6,849,300 B2 | 2/2005 | Kil et al. |
| 6,855,594 B1 | 2/2005 | Bhat et al. |
| 6,858,478 B2 | 2/2005 | Chau et al. |
| 6,858,493 B2 | 2/2005 | Ping et al. |
| 6,858,546 B2 | 2/2005 | Ninist et al. |
| 6,863,725 B2 | 3/2005 | Vaartstra et al. |
| 6,867,102 B2 | 3/2005 | Brask et al. |
| 6,870,210 B2 | 3/2005 | Ping et al. |
| 6,872,421 B2 | 3/2005 | Hwang |
| 6,881,260 B2 | 4/2005 | Marsh et al. |
| 6,887,800 B1 | 5/2005 | Metz et al. |
| 6,891,248 B2 | 5/2005 | Akram et al. |
| 6,893,915 B2 | 5/2005 | Park et al. |
| 6,893,984 B2 | 5/2005 | Ahn et al. |
| 6,900,122 B2 | 5/2005 | Ahn et al. |
| 6,908,639 B2 | 6/2005 | Basceri et al. |
| 6,909,133 B2 | 6/2005 | Furukawa et al. |
| 6,911,399 B2 | 6/2005 | Liu |
| 6,911,402 B2 | 6/2005 | Lee et al. |
| 6,914,295 B2 | 7/2005 | Chau et al. |
| 6,917,114 B2 | 7/2005 | Choi |
| 6,921,702 B2 | 7/2005 | Ahn et al. |
| 6,939,815 B2 | 9/2005 | Brask et al. |
| 6,942,813 B2 | 9/2005 | Ying et al. |
| 6,943,073 B2 | 9/2005 | Marsh et al. |
| 6,949,433 B1 | 9/2005 | Hidehiko et al. |
| 6,953,730 B2 | 10/2005 | Ahn et al. |
| 6,956,267 B2 | 10/2005 | Hattangady |
| 6,958,277 B2 | 10/2005 | Pomarede et al. |
| 6,958,300 B2 | 10/2005 | Vaartstra et al. |
| 6,958,302 B2 | 10/2005 | Ahn et al. |
| 6,960,537 B2 | 11/2005 | Shero et al. |
| 6,960,538 B2 | 11/2005 | Ahn et al. |
| 6,962,872 B2 | 11/2005 | Chudzik et al. |
| 6,967,159 B2 | 11/2005 | Vaartstra |
| 6,969,886 B1 | 11/2005 | Park et al. |
| 6,974,764 B2 | 12/2005 | Brask |
| 6,984,592 B2 | 1/2006 | Vaartstra |
| 6,989,338 B2 | 1/2006 | Choi |
| 6,995,081 B2 | 2/2006 | Vaartstra |
| 7,002,248 B2 | 2/2006 | Akram et al. |
| 7,030,042 B2 | 4/2006 | Vaartstra et al. |
| 7,033,884 B2 | 4/2006 | Basceri et al. |
| 7,038,284 B2 | 5/2006 | Haukka |
| 7,041,609 B2 | 5/2006 | Vaartstra |
| 7,077,902 B2 | 7/2006 | Vaartstra |
| 7,081,421 B2 | 7/2006 | Ahn et al. |
| 7,087,481 B2 | 8/2006 | Vaartstra et al. |
| 7,112,485 B2 | 9/2006 | Vaartstra |
| 7,115,166 B2 | 10/2006 | Vaartstra et al. |
| 7,115,528 B2 | 10/2006 | Vaartstra et al. |
| 7,122,464 B2 | 10/2006 | Vaartstra |
| 7,125,815 B2 | 10/2006 | Vaartstra |
| 7,196,007 B2 | 3/2007 | Vaartstra |
| 7,235,501 B2 | 6/2007 | Ahn et al. |
| 7,250,367 B2 | 7/2007 | Vaartstra et al. |
| 7,253,122 B2 | 8/2007 | Vaartstra |
| 7,271,077 B2 | 9/2007 | Vaartstra et al. |
| 7,294,556 B2 | 11/2007 | Vaartstra |
| 7,300,870 B2 | 11/2007 | Vaartstra |
| 7,332,442 B2 | 2/2008 | Vaartstra et al. |
| 7,365,027 B2 | 4/2008 | Ahn et al. |
| 7,368,402 B2 | 5/2008 | Vaartstra |
| 7,374,617 B2 | 5/2008 | Vaartstra |
| 7,374,964 B2 | 5/2008 | Ahn et al. |
| 7,390,756 B2 | 6/2008 | Ahn et al. |
| 7,393,736 B2 | 7/2008 | Ahn et al. |
| 7,399,666 B2 | 7/2008 | Ahn et al. |
| 7,410,910 B2 | 8/2008 | Ahn et al. |
| 7,410,918 B2 | 8/2008 | Vaartstra |
| 7,491,995 B2 | 2/2009 | Forbes |
| 7,494,939 B2 | 2/2009 | Ahn et al. |
| 7,498,247 B2 | 3/2009 | Ahn et al. |
| 7,508,648 B2 | 3/2009 | Ahn et al. |
| 7,510,983 B2 | 3/2009 | Ahn et al. |
| 7,560,395 B2 | 7/2009 | Ahn |
| 7,572,695 B2 | 8/2009 | Ahn et al. |
| 7,582,549 B2 | 9/2009 | Ahn et al. |
| 7,588,988 B2 | 9/2009 | Ahn et al. |
| 7,795,663 B2 * | 9/2010 | Suh et al. ........................ 257/310 |
| 2001/0029891 A1 | 10/2001 | Oh et al. |
| 2001/0031562 A1 | 10/2001 | Raaijmakers et al. |
| 2001/0053058 A1 | 12/2001 | Kim et al. |
| 2001/0053615 A1 | 12/2001 | Lim |
| 2002/0000598 A1 | 1/2002 | Kang et al. |
| 2002/0024080 A1 | 2/2002 | Derderian et al. |
| 2002/0025628 A1 | 2/2002 | Derderian et al. |
| 2002/0028555 A1 | 3/2002 | Boyd et al. |
| 2002/0043216 A1 | 4/2002 | Hwang et al. |
| 2002/0086507 A1 | 7/2002 | Park et al. |
| 2002/0089023 A1 | 7/2002 | Yu et al. |
| 2002/0098627 A1 | 7/2002 | Pomarede et al. |

(56) References Cited

U.S. PATENT DOCUMENTS

| | | |
|---|---|---|
| 2002/0103087 A1* | 8/2002 | Stauf et al. .................... 505/100 |
| 2002/0106536 A1 | 8/2002 | Lee et al. |
| 2002/0115252 A1 | 8/2002 | Haukka et al. |
| 2002/0125495 A1* | 9/2002 | Steckl et al. .................. 257/103 |
| 2002/0130340 A1 | 9/2002 | Ma et al. |
| 2002/0142588 A1 | 10/2002 | Basceri et al. |
| 2002/0153579 A1 | 10/2002 | Yamamoto |
| 2002/0163039 A1 | 11/2002 | Clevenger et al. |
| 2002/0173054 A1 | 11/2002 | Kim |
| 2002/0173130 A1 | 11/2002 | Pomerede et al. |
| 2002/0177282 A1 | 11/2002 | Song |
| 2002/0187578 A1 | 12/2002 | Hong |
| 2002/0192509 A1 | 12/2002 | Basceri et al. |
| 2002/0192974 A1 | 12/2002 | Ahn et al. |
| 2002/0192975 A1 | 12/2002 | Ahn |
| 2002/0195683 A1 | 12/2002 | Kim et al. |
| 2002/0197814 A1 | 12/2002 | Marsh et al. |
| 2002/0197856 A1 | 12/2002 | Matsuse et al. |
| 2003/0012965 A1 | 1/2003 | Droopad et al. |
| 2003/0015697 A1 | 1/2003 | Brophy et al. |
| 2003/0022408 A1 | 1/2003 | Barenburg et al. |
| 2003/0035313 A1 | 2/2003 | Lee et al. |
| 2003/0040162 A1 | 2/2003 | Cho et al. |
| 2003/0040197 A1 | 2/2003 | Cho |
| 2003/0042609 A1 | 3/2003 | Choi |
| 2003/0043637 A1 | 3/2003 | Forbes et al. |
| 2003/0045078 A1 | 3/2003 | Ahn et al. |
| 2003/0047771 A1 | 3/2003 | Kweon et al. |
| 2003/0048593 A1 | 3/2003 | Hong |
| 2003/0049942 A1 | 3/2003 | Haukka et al. |
| 2003/0052374 A1 | 3/2003 | Lee et al. |
| 2003/0054605 A1 | 3/2003 | Kim et al. |
| 2003/0054606 A1 | 3/2003 | Marsh et al. |
| 2003/0054634 A1 | 3/2003 | Lee et al. |
| 2003/0057445 A1 | 3/2003 | Kweon et al. |
| 2003/0057462 A1 | 3/2003 | An |
| 2003/0059959 A1 | 3/2003 | Hong |
| 2003/0060008 A1 | 3/2003 | Hong |
| 2003/0060042 A1 | 3/2003 | Park et al. |
| 2003/0060057 A1 | 3/2003 | Raaijmakers et al. |
| 2003/0064607 A1 | 4/2003 | Leu et al. |
| 2003/0072882 A1 | 4/2003 | Ninisto et al. |
| 2003/0072975 A1 | 4/2003 | Shero et al. |
| 2003/0092233 A1 | 5/2003 | Furukawa et al. |
| 2003/0104638 A1 | 6/2003 | Kim et al. |
| 2003/0106490 A1 | 6/2003 | Jallepally et al. |
| 2003/0114018 A1 | 6/2003 | Gutsche et al. |
| 2003/0116652 A1 | 6/2003 | Hwang et al. |
| 2003/0116804 A1 | 6/2003 | Visokay et al. |
| 2003/0124251 A1 | 7/2003 | Onozawa et al. |
| 2003/0124794 A1 | 7/2003 | Girardie |
| 2003/0124875 A1 | 7/2003 | Kil |
| 2003/0153146 A1 | 8/2003 | Won et al. |
| 2003/0162377 A1 | 8/2003 | Chau et al. |
| 2003/0165615 A1 | 9/2003 | Aaltonen et al. |
| 2003/0168689 A1 | 9/2003 | Basceri et al. |
| 2003/0176065 A1 | 9/2003 | Vaartstra |
| 2003/0181060 A1 | 9/2003 | Asai et al. |
| 2003/0183862 A1 | 10/2003 | Jin et al. |
| 2003/0185981 A1 | 10/2003 | Min et al. |
| 2003/0200917 A1 | 10/2003 | Vaartstra |
| 2003/0203567 A1 | 10/2003 | Yoon |
| 2003/0205750 A1 | 11/2003 | Basceri et al. |
| 2003/0205823 A1 | 11/2003 | Leu et al. |
| 2003/0207032 A1 | 11/2003 | Ahn et al. |
| 2003/0207540 A1 | 11/2003 | Ahn et al. |
| 2003/0222300 A1 | 12/2003 | Basceri et al. |
| 2003/0224217 A1 | 12/2003 | Byun |
| 2003/0227033 A1 | 12/2003 | Ahn et al. |
| 2003/0228747 A1 | 12/2003 | Ahn et al. |
| 2003/0233976 A1 | 12/2003 | Marsh et al. |
| 2003/0235064 A1 | 12/2003 | Batra et al. |
| 2004/0005724 A1 | 1/2004 | Lee et al. |
| 2004/0007759 A1 | 1/2004 | Chu et al. |
| 2004/0009307 A1 | 1/2004 | Koh et al. |
| 2004/0018747 A1 | 1/2004 | Lee et al. |
| 2004/0023516 A1 | 2/2004 | Londergan et al. |
| 2004/0035362 A1 | 2/2004 | Hwang et al. |
| 2004/0036097 A1 | 2/2004 | Ping et al. |
| 2004/0036099 A1 | 2/2004 | Ping et al. |
| 2004/0036127 A1 | 2/2004 | Chau et al. |
| 2004/0036157 A1 | 2/2004 | Akram et al. |
| 2004/0040494 A1 | 3/2004 | Vaartstra et al. |
| 2004/0040501 A1 | 3/2004 | Vaartstra |
| 2004/0040502 A1 | 3/2004 | Basceri et al. |
| 2004/0040503 A1 | 3/2004 | Basceri et al. |
| 2004/0043151 A1 | 3/2004 | Vaartstra |
| 2004/0043541 A1 | 3/2004 | Ahn et al. |
| 2004/0043557 A1 | 3/2004 | Haukka et al. |
| 2004/0043569 A1 | 3/2004 | Ahn et al. |
| 2004/0043578 A1 | 3/2004 | Marsh |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0048451 A1 | 3/2004 | Marsh et al. |
| 2004/0063100 A1 | 4/2004 | Wang |
| 2004/0066250 A1* | 4/2004 | Hunt et al. .................. 333/24 R |
| 2004/0106287 A1 | 6/2004 | Chau et al. |
| 2004/0106289 A1 | 6/2004 | Furukawa et al. |
| 2004/0108587 A1 | 6/2004 | Chudzik et al. |
| 2004/0110348 A1 | 6/2004 | Ahn et al. |
| 2004/0110391 A1 | 6/2004 | Ahn et al. |
| 2004/0121620 A1 | 6/2004 | Pomarede et al. |
| 2004/0126954 A1 | 7/2004 | Vaartstra et al. |
| 2004/0129200 A1 | 7/2004 | Kouvetakis et al. |
| 2004/0137648 A1 | 7/2004 | An |
| 2004/0141390 A1 | 7/2004 | Won et al. |
| 2004/0144980 A1 | 7/2004 | Ahn et al. |
| 2004/0147088 A1 | 7/2004 | Hong |
| 2004/0147101 A1 | 7/2004 | Pomarede et al. |
| 2004/0149213 A1 | 8/2004 | Besceri et al. |
| 2004/0149991 A1 | 8/2004 | Won |
| 2004/0152254 A1 | 8/2004 | Vaartstra et al. |
| 2004/0159898 A1 | 8/2004 | Hattangady et al. |
| 2004/0161899 A1 | 8/2004 | Luo et al. |
| 2004/0164357 A1 | 8/2004 | Ahn et al. |
| 2004/0166628 A1 | 8/2004 | Park et al. |
| 2004/0171212 A1 | 9/2004 | Won et al. |
| 2004/0173570 A1 | 9/2004 | Ying et al. |
| 2004/0175882 A1 | 9/2004 | Ahn et al. |
| 2004/0180523 A1 | 9/2004 | Brask et al. |
| 2004/0183108 A1 | 9/2004 | Ahn |
| 2004/0185627 A1 | 9/2004 | Brask et al. |
| 2004/0185654 A1 | 9/2004 | Ahn |
| 2004/0187968 A1 | 9/2004 | Vaartstra |
| 2004/0197946 A1 | 10/2004 | Vaartstra et al. |
| 2004/0203213 A1 | 10/2004 | Chung |
| 2004/0209430 A1 | 10/2004 | Choi et al. |
| 2004/0214399 A1 | 10/2004 | Ahn et al. |
| 2004/0219746 A1 | 11/2004 | Vaartstra et al. |
| 2004/0222474 A1 | 11/2004 | Chau et al. |
| 2004/0222476 A1 | 11/2004 | Ahn et al. |
| 2004/0224502 A1 | 11/2004 | Kim et al. |
| 2004/0235242 A1 | 11/2004 | Basceri et al. |
| 2004/0235251 A1 | 11/2004 | Brask et al. |
| 2004/0235260 A1 | 11/2004 | Lee et al. |
| 2004/0235285 A1 | 11/2004 | Kang et al. |
| 2004/0237892 A1 | 12/2004 | Basceri et al. |
| 2004/0238957 A1 | 12/2004 | Akram et al. |
| 2004/0241916 A1 | 12/2004 | Chau et al. |
| 2004/0241940 A1 | 12/2004 | Lee et al. |
| 2004/0262262 A1 | 12/2004 | Chiu et al. |
| 2004/0262635 A1 | 12/2004 | Lee |
| 2004/0262700 A1 | 12/2004 | Ahn et al. |
| 2004/0264102 A1 | 12/2004 | Ping et al. |
| 2004/0266217 A1 | 12/2004 | Kim et al. |
| 2005/0009266 A1 | 1/2005 | Vaartstra |
| 2005/0009368 A1 | 1/2005 | Vaartstra |

(56) References Cited

U.S. PATENT DOCUMENTS

| | | | |
|---|---|---|---|
| 2005/0009370 A1 | 1/2005 | Ahn |
| 2005/0012223 A1 | 1/2005 | Koller et al. |
| 2005/0019978 A1 | 1/2005 | Vaartstra et al. |
| 2005/0020017 A1 | 1/2005 | Ahn et al. |
| 2005/0020060 A1 | 1/2005 | Aaltonen et al. |
| 2005/0023594 A1 | 2/2005 | Ahn et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023664 A1 | 2/2005 | Chudzik et al. |
| 2005/0026349 A1 | 2/2005 | Forbes et al. |
| 2005/0028733 A1 | 2/2005 | Vaartstra |
| 2005/0028927 A1 | 2/2005 | Basceri et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0032292 A1 | 2/2005 | Ahn et al. |
| 2005/0032302 A1 | 2/2005 | Bhat et al. |
| 2005/0032325 A1 | 2/2005 | Bhat et al. |
| 2005/0032346 A1 | 2/2005 | Graettinger |
| 2005/0032360 A1 | 2/2005 | Vaartstra |
| 2005/0037563 A1 | 2/2005 | Ahn |
| 2005/0042820 A1 | 2/2005 | Choi |
| 2005/0048794 A1 | 3/2005 | Brask et al. |
| 2005/0054165 A1 | 3/2005 | Ahn et al. |
| 2005/0062130 A1 | 3/2005 | Ciancio et al. |
| 2005/0063141 A1 | 3/2005 | Jeong et al. |
| 2005/0064605 A1 | 3/2005 | Lee et al. |
| 2005/0064719 A1 | 3/2005 | Liu et al. |
| 2005/0070041 A1 | 3/2005 | Wu et al. |
| 2005/0074982 A1 | 4/2005 | Lee et al. |
| 2005/0077519 A1 | 4/2005 | Ahn et al. |
| 2005/0077548 A1 | 4/2005 | Furukawa et al. |
| 2005/0082587 A1 | 4/2005 | Marsh |
| 2005/0082625 A1 | 4/2005 | Kim et al. |
| 2005/0082637 A1 | 4/2005 | Mikawa |
| 2005/0085090 A1 | 4/2005 | Mui et al. |
| 2005/0087749 A1* | 4/2005 | Magnitski et al. .............. 257/88 |
| 2005/0094452 A1 | 5/2005 | Lee et al. |
| 2005/0101113 A1 | 5/2005 | Brask et al. |
| 2005/0106893 A1 | 5/2005 | Wilk |
| 2005/0110063 A1 | 5/2005 | Huang et al. |
| 2005/0124171 A1 | 6/2005 | Vaartstra |
| 2005/0124175 A1 | 6/2005 | Ahn et al. |
| 2005/0128029 A1 | 6/2005 | Lee et al. |
| 2005/0130442 A1 | 6/2005 | Visokay et al. |
| 2005/0136677 A1 | 6/2005 | Brask et al. |
| 2005/0136689 A9 | 6/2005 | Vaartstra |
| 2005/0145957 A1 | 7/2005 | Ahn et al. |
| 2005/0148130 A1 | 7/2005 | Doczy et al. |
| 2005/0148131 A1 | 7/2005 | Brask |
| 2005/0148136 A1 | 7/2005 | Brask et al. |
| 2005/0148137 A1 | 7/2005 | Brask et al. |
| 2005/0152094 A1 | 7/2005 | Jeong et al. |
| 2005/0156171 A1 | 7/2005 | Brask et al. |
| 2005/0158973 A1 | 7/2005 | Ahn et al. |
| 2005/0158974 A1 | 7/2005 | Chau et al. |
| 2005/0160981 A9 | 7/2005 | Vaartstra et al. |
| 2005/0164466 A1 | 7/2005 | Zheng et al. |
| 2005/0164521 A1 | 7/2005 | Ahn et al. |
| 2005/0181590 A1 | 8/2005 | Chiu et al. |
| 2005/0185486 A9 | 8/2005 | Lee |
| 2005/0189598 A1 | 9/2005 | Jang et al. |
| 2005/0191820 A1 | 9/2005 | Tu et al. |
| 2005/0199880 A1 | 9/2005 | Hoffman et al. |
| 2005/0199881 A1 | 9/2005 | Hoffman et al. |
| 2005/0199949 A1 | 9/2005 | Chau et al. |
| 2005/0199960 A1 | 9/2005 | Hoffman et al. |
| 2005/0199961 A1 | 9/2005 | Hoffman et al. |
| 2005/0212119 A1 | 9/2005 | Shero et al. |
| 2005/0213280 A1 | 9/2005 | Azrai et al. |
| 2005/0215015 A1 | 9/2005 | Ahn et al. |
| 2005/0218462 A1 | 10/2005 | Ahn et al. |
| 2005/0221006 A1 | 10/2005 | Vaartstra |
| 2005/0224863 A1 | 10/2005 | Heida |
| 2005/0227442 A1 | 10/2005 | Ahn et al. |
| 2005/0230729 A1 | 10/2005 | Won |
| 2005/0233520 A1 | 10/2005 | Choi |
| 2005/0233529 A1 | 10/2005 | Pomarede et al. |
| 2005/0259212 A1 | 11/2005 | Lee et al. |
| 2005/0266619 A1 | 12/2005 | Brask et al. |
| 2005/0272270 A1 | 12/2005 | Metz et al. |
| 2005/0280061 A1 | 12/2005 | Lee |
| 2005/0280154 A1 | 12/2005 | Lee |
| 2005/0287740 A1 | 12/2005 | Wu et al. |
| 2005/0287804 A1 | 12/2005 | Vaartstra |
| 2005/0287819 A1 | 12/2005 | Vaartstra et al. |
| 2006/0001052 A1 | 1/2006 | Ping |
| 2006/0006449 A1 | 1/2006 | Jeong et al. |
| 2006/0006471 A1 | 1/2006 | Rossel et al. |
| 2006/0009043 A1 | 1/2006 | Cho et al. |
| 2006/0014369 A1 | 1/2006 | Graettinger |
| 2006/0017104 A1 | 1/2006 | Yoon et al. |
| 2006/0019483 A1 | 1/2006 | Barth et al. |
| 2006/0022236 A1 | 2/2006 | Shin et al. |
| 2006/0022240 A1 | 2/2006 | Huang et al. |
| 2006/0022245 A1 | 2/2006 | Jeong et al. |
| 2006/0022262 A1 | 2/2006 | Yoon et al. |
| 2006/0024975 A1 | 2/2006 | Ahn et al. |
| 2006/0046521 A1 | 3/2006 | Vaartstra et al. |
| 2006/0048711 A1 | 3/2006 | Vaartstra |
| 2006/0125030 A1 | 6/2006 | Ahn et al. |
| 2006/0148180 A1 | 7/2006 | Ahn et al. |
| 2006/0172485 A1 | 8/2006 | Vaartstra |
| 2006/0223337 A1 | 10/2006 | Ahn et al. |
| 2006/0231017 A1 | 10/2006 | Vaartstra |
| 2006/0244082 A1 | 11/2006 | Ahn et al. |
| 2006/0252244 A1 | 11/2006 | Vaartstra et al. |
| 2006/0252279 A1 | 11/2006 | Vaartstra |
| 2006/0258175 A1 | 11/2006 | Vaartstra et al. |
| 2006/0261389 A1 | 11/2006 | Vaartstra |
| 2006/0273366 A1* | 12/2006 | Ko et al. ....................... 257/295 |
| 2006/0292788 A1 | 12/2006 | Vaartstra |
| 2007/0006798 A1 | 1/2007 | Vaartstra et al. |
| 2007/0018214 A1 | 1/2007 | Ahn |
| 2007/0049023 A1 | 3/2007 | Ahn et al. |
| 2007/0049054 A1 | 3/2007 | Ahn et al. |
| 2007/0134931 A1 | 6/2007 | Ahn et al. |
| 2007/0134942 A1 | 6/2007 | Ahn et al. |
| 2007/0144438 A1 | 6/2007 | Vaartstra |
| 2007/0155190 A1 | 7/2007 | Vaartstra et al. |
| 2007/0161260 A1 | 7/2007 | Vaartstra |
| 2007/0166999 A1 | 7/2007 | Vaartstra |
| 2007/0295273 A1 | 12/2007 | Vaartstra |
| 2008/0048225 A1 | 2/2008 | Ahn et al. |
| 2008/0064210 A1 | 3/2008 | Vaartstra |
| 2008/0102629 A1 | 5/2008 | Vaartstra |

OTHER PUBLICATIONS

International Application No. PCT/US2007/018137, Written Opinion, dated Jan. 25, 2008, 5 pgs.

Ahn, Kie Y., et al., "Semiconductor Constructions Comprising Cerium Oxide and Titanium Oxide; and Methods of Forming Semiconductor Constructions", U.S. Appl. No. 10/881,874, filed Jun. 29, 2004.

Block, Bruce A., et al., "BaTiO$_3$ Thin Films for Optically Active Waveguides", *Integrated Ferroelectrics*, vol. 7, (1995), 25-31.

Chen, Wei, et al., "Photoluminescence and photostimulated luminescence of Tb$^{3+}$ and Eu$^{3+}$ in zeolite-Y", *Journal of Applied Physics*, vol. 88, No. 3, (Aug. 1, 2000), 1424-1431.

Gill, D. M., et al., "Guided wave absorption and fluorescence in epitaxial Er:BaTiO$_3$ on MgO", *Thin Solid Films 365*, (2000), 126-128.

Gill, D. M., et al., "Thin-film channel waveguide electro-optic modulator in epitaxial BaTiO$_3$", *Appl. Phys. Lett.* 71(13), (Sep. 29, 1997), 1783-1785.

Greenwald, Anton C., et al., "MOCVD Erbium Sources", *Mater. Res. Symp. Proc. 302*, (1993), 21-26.

Heikenfeld, J., et al., "Low-voltage GaN:Er green electroluminescent devices", *Applied Physics Letters*, vol. 76, No. 11, (Mar. 13, 2000), 1365-1367.

(56) References Cited

OTHER PUBLICATIONS

Heikenfeld, J., et al., "Red light emissin by photoluminescence and electroluminescence from Eu-doped GaN", *Applied Physics Letters*, vol. 75, No. 9, (Aug. 30, 1999), 1189-1191.

Hommerich, U., et al., "Photoluminescence studies of rare earth (Er, Eu, Tm) in situ doped GaN", *Materials Science and Engineering B105*, (2003), 91-96.

Iijima, K., et al., "Preparation of ferroelectric $BaTiO_3$ thin films by activated reactive evaporation", *Appl. Phys. Lett.* 56(61), (Feb. 5, 1990), 527-529.

Iwamoto, K., "Advanced Layer-By-Layer Deposition and Annealing Process for High-Quality High-K Dielecrics Formations", *Electrochemical Society Proceedings* vol. 203 (14), (2003), 265-272.

Kim, Sangsub, et al., "Structural characterization of peitaxial $BaTiO_3$ thin films grown by sputter deposition on MgO(100)", *J. Appl. Phys.* 78(9), (Nov. 1, 1995), 5604-5606.

Kim, Won-Jeong, et al., "Structure of Ferroelectric (Ba,Sr)$TiO_3$ Thin Films for Tunable Microwave Devices", *Integrated Ferroelectrics*, 66(1, (Sep. 2004), 321-327.

Kumar, D., et al., "Enhancement of cathodoluminescent and photoluminescent properties fo Eu:$Y_2O_3$ luminescent films by vacuum cooling", *Applied Physics Letters*, vol. 77, No. 16, (Oct. 16, 2000), 2518-2520.

Kuo, Shou-Yi, et al., "Structural and optical properties of erbium-doped $Ba_{0.7}Sr_{0.3}Ti_{O3}$ thin films", *J. Vac. Sci. Technol. A*, 23(4), (Jul./Aug. 2005), 768-772.

Kwak, B. S., et al., "Metalorganic chemical vapor deposition of $BaTi_{O3}$ thin films", *J. Appl. Phys.* 69(2), (Jan. 15, 1991), 767-772.

Langer, Dietrich, et al., "MOCVD Growth and Properties of Erbium Doped GaAs", *Mater. Res. Symp. Proc.* 301, (1993), 15-20.

Lee, Burtrand, et al., "Preparation, structiure evolution and dielectric properties of $BaTi_{O3}$ thin films and powders by an aqueous sol-gel process", *Thin Solid Films 388*, (2001), 107-113.

Leskela, M., "ALD precursor chemistry: Evolution and future challenges", *J. Phys. IV France*, 9, (1999), 837-852.

Manning, H. Montgomery, "Methods of Forming Semiconductor Structures and Capacitor Devices", U.S. Appl. No. 10/894,633, filed Jul. 19, 2004, 74 pages.

McKee, R. A., et al., "Molecular beam epitaxy growth of epitaxial barium silicide, barium oxide, and barium titanate on silicon", *Appl. Phys. Lett.* 59(7), (Aug. 12, 1991), 782-784.

Nashimoto, Keiichi, et al., "Epitaxial $BaTiO_3$/MgO Structure Grown on GaAs(100) by Pulsed Laser Deposition", *Jpn. J. Appl. Phys.*vol. 32, Part 1, No. 9B, (Sep. 1993), 4099-4102.

Paivasaari, Jani, et al., "Atomic layer deposition of rare earth oxides: erbium oxide thin films from Beta-diketonate and ozone precursors", *Journal of Alloys and Compounds*, 374(1-2), (Jul. 2004), 124-128.

Palathinkal, Thomas Joseph, et al., "Low Loss Tunable Thick Films Based on (Ba,Sr)$TiO_3$ and $Ba4Ti_{13}O_{30}$ Materials", *Integrated Ferroelectrics*, 66, (2004), 213-221.

Ritala, M., "Atomic layer deposition of oxide thin films with metal alkoxides as oxygen sources", *Science*, 288(5464), (Apr. 14, 2000), 319-321.

Shen, C., et al., "Photoluminescence properties of $Er^{3+-doped Ba0.5Sr}_{0.5}TiO_3$ prepared by sol-gel synthesis", *Materials Science and Engineering B,Elsevier Sequoia*, Lausanne, CH, vol. 111(1), (Aug. 15, 2004), 31-35.

Shojiya, Masanori, et al., "Upconversion luminescence of $Er^{3+}$ in chloride glasses based on $ZnCl_2$ or $CdCl_2$", *Applied Physics Letters* 65(15), (Oct. 10, 1994), 1874-1876.

Sneh, Ofer, "Thin film atomic layer deposition equipment for semiconductor processing", *Thin Solid Films*, 402, (2002), 248-261.

Suntola, T., "Atomic Layer Epitaxy", *Handbook of Crystal Growth, 3: Thin Films of Epitaxy, Part B: Growth Mechanics and Dynamics*, Amsterdam, (1994), 601-663.

Suntola, Tuomo, "Atomic layer epitaxy", *Thin Solid Films*, 215(1), (Aug. 28, 1992), 84-89.

Tanner, Peter A., et al., "Preformed sold-gel synthesisa dn characterization of lanthanide ion-doped yttria-alumina materials", *phys. stat. sol.* (a) 199, No. 3, (2003), 403-415.

Thee, Paul L., et al., "$Pr^{3+}$ luminescence in GaAs and $Al_xGa_{1-x}As$ implated with Pr", *Journal of Applied Physics*, 78(7), (Oct. 1, 1995), 4651-4658.

Van, Trinh Tu, et al., "Controlled erbium incorporation and photoluminescence of Er-doped $Y_2O_3$", *Applied Physics Letters*, 87, (Jul. 1, 2005), 011901-1-011907-3.

Vehkamaki, Marko, "Growth of $SrTiO_3$ and $BaTiO_3$ Thin Films by Atomic Layer Deposition", *Electrochemical and Solid-State Letters*, vol. 2, No. 10, (Oct. 1999), 504-506.

Wang, Z., et al., "Electrical properties of $SrTiO_3/BaTiO_3$ strained superlattice films prepared by atomic layer metallorganic chemical vapour deposition", *Journal of the Electrochemical Society Electrochem. Soc USA*, vol. 147(12), (Dec. 2000), 4615-4617.

Wilk, G. D., "High-K gate dielectrics: Current status and materials properties considerations", *Journal of Applied Physics*, 89(10), (May 2001), 5243-5275.

Zhang, H. X., et al., "Green upconversion luminescence in $Ef^{3+}:BaTiO_3$films", *Applied Physics Letters*, vol. 77, No. 5, (Jul. 31, 2000), 609-611.

Zhang, H. X., et al., "Visible up-conversion luminescence in $Er^{3+:BaTiO}_3$ nanocrystals", *Optical Materials 15*, (2000), 47-50.

Wang, Z., et al., "Electrical Properties of $SrTiO_3/BaTiO_3$ Strained Superlattice Films Prepared by Atomic Layer Metallorganic Chemical Vapor Deposition", Journal of the Electrochemical Society, 147(2), (2000), 4615-4617.

U.S. Appl. No. 11/510,803, Restriction Requirement mailed May 6, 2008, 7 pgs.

International Application Serial No. PCT/US2007/018137, International Preliminary Report on Patentability mailed Mar. 12, 2009, 7 pgs.

Taiwan Application Serial No. 096131531, Response filed Dec. 27, 2012 to Final Office Action mailed Oct. 23, 2012, 10 pgs.

Taiwan Application Serial No. 096131531, Office Action mailed Jun. 16, 2011, with English translation, 16 pgs.

Taiwanese Application Serial No. 096131531, Final Office Action mailed Oct. 23, 2012, w/ English Translation, 7 pgs.

Taiwanese Application Serial No. 096131531, Office Action mailed Dec. 29, 2011, 15 pgs.

Taiwanese Application Serial No. 096131531, Response filed Mar. 30, 2012 to Office Action mailed Dec. 29, 2011, 14 pgs.

Taiwanese Application Serial No. 096131531, response filed Sep. 16, 2011 to Office Action mailed Jun. 16, 2011, 13 pgs.

\* cited by examiner

US 8,581,352 B2

ELECTRONIC DEVICES INCLUDING BARIUM STRONTIUM TITANIUM OXIDE FILMS

RELATED APPLICATION

This application is a divisional application of U.S. application Ser. No. 11/510,803, filed 25 Aug. 2006, now U.S. Pat. No. 7,582,549, which is incorporated herein by reference in its entirety.

TECHNICAL FIELD

This application relates generally to semiconductor devices and device fabrication.

BACKGROUND

The semiconductor device industry has a market driven need to reduce the size of devices used in products such as processor chips, mobile telephones, and memory devices such as dynamic random access memories (DRAMs). Currently, the semiconductor industry relies on the ability to reduce or scale the dimensions of its basic devices. This device scaling includes scaling dielectric layers in devices such as, for example, capacitors and silicon based metal oxide semiconductor field effect transistors (MOSFETs) and variations thereof, which have primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other materials as dielectric regions in a variety of electronic structures.

DETAILED DESCRIPTION

Figure 1:
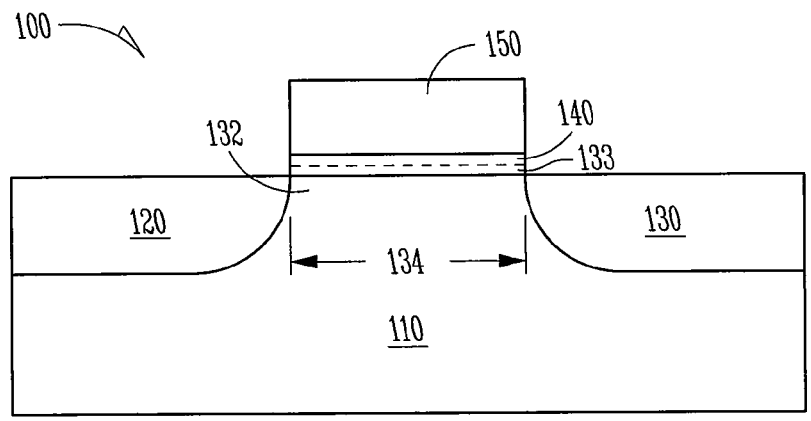
FIG. 1 shows a representation of an embodiment of a transistor having a dielectric layer containing a barium strontium titanium oxide film, an erbium-doped barium strontium titanium oxide film, or a combination thereof.

The following detailed description refers to the accompanying drawings that show, by way of illustration, embodiments in which the present invention may be practiced. These embodiments are described in sufficient detail to enable those skilled in the art to practice embodiments of the present invention. Other embodiments may be utilized and structural, logical, and electrical changes may be made. The various embodiments are not necessarily mutually exclusive, as some embodiments can be combined with one or more other embodiments to form new embodiments.

The term substrate used in the following description includes any structure having an exposed surface with which to form a structure such as an integrated circuit (IC) structure. The term substrate is understood to include a semiconductor wafer. The term substrate is also used to refer to semiconductor structures during processing, and may include other layers that have been fabricated thereupon. A substrate includes doped and undoped semiconductors, epitaxial semiconductor layers supported by a base semiconductor or insulator, as well as other semiconductor structures known to those skilled in the art. The term conductor is understood to generally include n-type and p-type semiconductors, and the term insulator or dielectric is defined to include any material that is less electrically conductive than the materials referred to as conductors. The following detailed description is, therefore, not to be taken in a limiting sense.

In an embodiment, a barium strontium titanium oxide film is formed using atomic layer deposition (ALD). In an embodiment, an erbium-doped barium strontium titanium oxide film is formed using atomic layer deposition. Various forms of ALD may be used including radical-enhanced atomic layer deposition. Embodiments include structures for capacitors, transistors, memory devices, optoelectronic devices, and systems with a barium strontium titanium oxide film, an erbium-doped barium strontium titanium oxide film, or a combination thereof structured as one or more monolayers, and methods for forming such structures. Forming such a dielectric film using atomic layer deposition allows for the control of transitions between material layers. As a result of such control, both atomic layer deposited barium strontium titanium oxide dielectric films and atomic layer deposited erbium-doped barium strontium titanium oxide dielectric films can have an engineered transition with the surface of a material on which is configured.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds. Pulse times for purging gases may be significantly longer, for example, pulse times of about 5 to about 30 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Atomic layer deposition provides control of film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that may all be identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. An ALD sequence for a metal oxide may be referenced with respect to the metal and oxygen. For example, erbium oxide may be formed using a sequence including $Er(thd)_3$ (thd=2,2,6,6 tetramethyl-3,5-heptanedone) and ozone, as its reactant precursor, where such a sequence may be referred to as an erbium/oxygen sequence or an erbium sequence. In various ALD processes that form an oxide or a compound that contains oxygen, a reactant precursor that contains oxygen is used to supply the oxygen. Herein, a precursor that contains oxygen and that supplies oxygen to be incorporated in the ALD composition formed, which may be used in an ALD process with precursors supplying the other elements in the ALD compound, is referred to as an oxygen reactant precursor. With an ALD process using $Er(thd)_3$ and ozone, ozone is an oxygen reactant precursor. An ALD cycle may include pulsing a precursor, pulsing a purging gas for the precursor, pulsing a reactant precursor, and pulsing the reactant precursor's purging gas. An ALD cycle may include pulsing a precursor, evacuating the reactant chamber, pulsing a reactant precursor, and evacuating the reactant chamber. An ALD cycle may include pulsing a precursor, pulsing a purging gas for the precursor and evacuating the reactant chamber, pulsing a reactant precursor, and pulsing the reactant precursor's purging gas and evacuating the reactant chamber.

In forming a layer of a metal species, an ALD sequence may deal with pulsing a reactant precursor to the substrate surface on which a metal-containing species has been adsorbed such that the reactant precursor reacts with the metal-containing species resulting in the metal and a gaseous by-product that can be removed during the subsequent purging/evacuating process. Alternatively, in forming a layer of a metal species, an ALD sequence may deal with reacting a precursor containing the metal species with a substrate surface. A cycle for such a metal forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a material composition having more than two elements, a cycle may include a number of sequences to provide the elements of the composition. For example, a cycle for an ALD formation of an $ABO_x$ composition may include sequentially pulsing a first precursor/a purging gas for the first precursor/a first reactant precursor/ the first reactant precursor's purging gas/a second precursor/a purging gas for the second precursor/a second reactant precursor/the second reactant precursor's purging gas, which may be viewed as a cycle having two sequences. In an embodiment, a cycle may include a number of sequences for element A and a different number of sequences for element B. There may be cases in which ALD formation of an $ABO_x$ composition uses one precursor that contains the elements A and B, such that pulsing the AB containing precursor followed by its reactant precursor onto a substrate may include a reaction that forms $ABO_x$ on the substrate to provide an AB/oxygen sequence. A cycle of an AB/oxygen sequence may include pulsing a precursor containing A and B, pulsing a purging gas for the precursor, pulsing an oxygen reactant precursor to the A/B precursor, and pulsing a purging gas for the reactant precursor. A cycle may be repeated a number of times to provide a desired thickness of the composition. In an embodiment, a cycle for an ALD formation of a composition of barium strontium titanium oxide may include a number of barium, strontium, and titanium sequences, which may be viewed as a cycle having multiple sequences. In an embodiment, a cycle for an ALD formation of a composition of erbium-doped barium strontium titanium oxide may include interspersing erbium sequences among a number of barium, strontium, and titanium sequences. In an embodiment, a layer substantially of a barium strontium titanium oxide is formed on a substrate mounted in a reaction chamber using ALD in repetitive barium/strontium/titanium sequences using precursor gases individually pulsed into the reaction chamber. In an embodiment, a layer substantially of a barium strontium titanium oxide doped with erbium is formed on a substrate mounted in a reaction chamber using ALD in repetitive barium/strontium/titanium sequences with a limited number of erbium sequences using precursor gases individually pulsed into the reaction chamber. Solid or liquid precursors can be used in an appropriately designed reaction chamber.

In an embodiment, a barium strontium titanium oxide layer may be structured as one or more monolayers. A film of barium strontium titanium oxide, structured as one or more monolayers, may have a thickness that ranges from a monolayer to thousands of angstroms or more. In an embodiment, an erbium-doped barium strontium titanium oxide layer may be structured as one or more monolayers. A film of erbium-doped barium strontium titanium oxide, structured as one or more monolayers, may have a thickness that ranges from a monolayer to thousands of angstroms or more. Both the film of barium strontium titanium oxide and the film of erbium-doped barium strontium titanium oxide may be processed using atomic layer deposition. Embodiments of an atomic layer deposited barium strontium titanium oxide layer, an atomic layer deposited erbium-doped barium strontium titanium oxide, or combinations thereof have a larger dielectric constant than silicon dioxide. Such dielectric layers provide a significantly thinner equivalent oxide thickness compared with a silicon oxide layer having the same physical thickness. The equivalent oxide thickness, $t_{eq}$, quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations. Alternatively, such dielectric layers provide a significantly thicker physical thickness than a silicon oxide layer having the same equivalent oxide thickness. This increased physical thickness aids in reducing leakage current.

The term barium strontium titanium oxide is used herein with respect to a composition that essentially consists of barium, strontium, titanium, and oxygen. The term erbium-doped barium strontium titanium oxide is used herein with respect to a composition that essentially consists of erbium, barium, strontium, titanium, and oxygen in which the form of the composition has a limited amount of erbium relative to barium, strontium, and titanium. Barium strontium titanium oxide may be constructed as a film or other form that may be stoichiometric, non-stoichiometric, or a combination thereof. Erbium-doped barium strontium titanium oxide may be constructed as a film or other form that may be near stoichiometric, non-stoichiometric, or a combination thereof. Herein, a barium strontium titanium oxide composition may be expressed as BaSrTiO, $BaSrTiO_x$, BST, or other equivalent form. Herein, an erbium-doped barium strontium titanium oxide composition may be expressed as Er-doped BaSrTiO, Er-doped $BaSrTiO_x$, Er-doped BST, BST:Er, or other equivalent form. The term barium oxide is used herein with respect to a composition that essentially consists of barium and oxygen. The term strontium oxide is used herein with respect to a composition that essentially consists of strontium and oxygen. The term titanium oxide is used herein with respect to a composition that essentially consists of titanium and oxygen. The term erbium oxide is used herein with respect to a composition that essentially consists of erbium and oxygen. The expression $BaO_u$ layer may be used to include a barium oxide layer that is substantially stoichiometric, non-stoichiometric, or a combination thereof. Expressions $SrO_v$, $TiO_r$, and $ErO_w$ may be used in the same manner as $BaO_u$. In various embodiments, a barium strontium titanium oxide film may be doped with elements or compounds other than barium, strontium, titanium, and oxygen. In various embodiments, an erbium-doped barium strontium titanium oxide film may be doped with elements or compounds other than erbium, barium, strontium, titanium, and oxygen.

Prior to forming a $BaSrTiO_x$ film or an Er-doped $BaSrTiO_x$ film using ALD, the surface on which the $BaSrTiO_x$ film or Er-doped $BaSrTiO_x$ film is to be deposited may undergo a preparation stage. The surface may be the surface of a substrate for an electronic device, such as an integrated circuit, or an optoelectronic device. In an embodiment, the substrate used for forming a transistor may include a silicon or silicon containing material. In other embodiments, germanium, gallium arsenide, indium phosphide, silicon-on-sapphire substrates, or other suitable substrates may be used. A preparation process may include cleaning the substrate and forming layers and regions of the substrate, such as drains and sources, prior to forming a gate dielectric in the formation of a metal oxide semiconductor (MOS) transistor. Alternatively, active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of a native oxide as an interface between a substrate and a BaSrTiO dielectric or an Er-doped BaSrTiO dielectric formed using the atomic layer deposition process. The material composition of an interface layer and its properties are typically dependent on process conditions and the condition of the substrate before forming the dielectric layer. Though the existence of an interface layer may effectively reduce the dielectric constant associated with the dielectric layer and its substrate, an interface layer, such as a native oxide interface layer, a $SiO_2$ interface layer, or other composition interface layer, may improve the interface density, fixed charge density, and channel mobility of a device having this interface layer.

The sequencing of the formation of the regions of an electronic device, such as a transistor, being processed may follow typical sequencing that is generally performed in the fabrication of such devices as is well known to those skilled in the art. Included in the processing prior to forming a dielectric may be the masking of substrate regions to be protected during the dielectric formation, as is typically performed in semiconductor fabrication. In an embodiment, the unmasked region includes a body region of a transistor; however, one skilled in the art will recognize that other semiconductor device structures may utilize this process.

In various embodiments, between each pulsing of precursors used in an atomic layer deposition process, a purging gas may be pulsed into the ALD reaction chamber. Between each pulsing of precursors, the ALD reactor chamber may be evacuated using vacuum techniques as is known by those skilled in the art. Between each pulsing of precursors, a purging gas may be pulsed into the ALD reaction chamber and the ALD reactor chamber may be evacuated.

In an embodiment, layers of barium titanium oxide, $BaTiO_y$, are formed by atomic layer deposition among layers of strontium titanium oxide, $SrTiO_z$, that are formed by atomic layer deposition. The $BaTiO_y$ layers and the $SrTiO_z$ layers may be annealed to form a layer of $BaSrTiO_x$. The order of forming the $BaTiO_y$ layers and the $SrTiO_z$ layers may be selected dependent upon a desired application. In an embodiment, layers of $ErO_w$ formed by atomic layer deposition may be interspersed among layers of $BaTiO_y$ that are formed by atomic layer deposition and layers of $SrTiO_z$ that are formed by atomic layer deposition. The $ErO_w$ layers, the $BaTiO_y$ layers, and the $SrTiO_z$ oxide layers may be annealed to form a layer of Er-doped $BaSrTiO_x$. The order of forming $ErO_w$ layers, the $BaTiO_y$ layers, and the $SrTiO_z$ layers may be selected dependent upon a desired application.

In an embodiment, to form barium titanium oxide by atomic layer deposition, a barium-containing precursor is pulsed onto a substrate in an ALD reaction chamber. A number of precursors containing barium may be used to provide the barium to a substrate. In an embodiment, a precursor containing barium may include barium bis(pentamethlcyclopentadienyl, $[Ba(C_5Me_5)_2$ where $Me=CH_3]$. Water vapor may be used as an oxygen reactant precursor in an ALD sequence with $Ba(C_5Me_5)_2$. In an embodiment, the substrate temperature may be maintained at a temperature of about 275° C. A titanium-containing precursor is used in a titanium sequence and may be pulsed to the substrate after the barium sequence. A number of precursors containing titanium may be used to provide the titanium to the substrate. In an embodiment, a titanium precursor pulsed may be titanium tetraisopropoxide, also written as $Ti(O^i\text{---}Pr)_4$, where $Pr=CH_2CH_2CH_3$. In an embodiment, the substrate temperature may be maintained at a temperature ranging from less than 250° C. to about 325° C. Other titanium precursors that may be used in an ALD process include titanium halides, such as $TiCl_4$ or $TiI_4$, and $Ti(NO_3)_4$. In an embodiment, during formation of a $BaTiO_y$ film, the substrate may be maintained at a temperature of about 275° C. In an embodiment, during formation of a $BaTiO_y$ film, the substrate may be maintained at a temperature ranging from about 250° C. to about 500° C. Use of the individual precursors is not limited to the temperature ranges of the above embodiments. Further, forming barium titanium oxide by atomic layer deposition is not limited to the abovementioned precursors. In various embodiments for ALD formation of $BaTiO_y$, the reactant precursor used in the different sequences may be an oxygen reactant precursor including, but not limited to, one or more of water vapor, atomic oxygen, molecular oxygen, ozone, hydrogen peroxide, a water-hydrogen peroxide mixture, alcohol, or nitrous oxide. In addition, the pulsing of the individual precursors in a sequence may use a pulsing period that provides uniform coverage of a monolayer on the surface or may use a pulsing period that provides partial coverage of a monolayer on the surface during a given sequence.

Embodiments for forming a $BaTiO_y$ film by atomic layer deposition may include numerous permutations of barium sequences and titanium sequences for forming the $BaTiO_y$ film. In an embodiment, a titanium sequence is conducted before a barium sequence. In an embodiment, a barium sequence is conducted before a titanium sequence. In an embodiment, a barium/titanium cycle may include a number, n, of barium sequences, and a number, p, of titanium sequences. The number of sequences n and p may be selected to engineer the relative amounts of titanium to barium. The permittivity of the formed $BaTiO_y$ film may be engineered based on the ratio of barium sequences to titanium sequences. In an embodiment, associated pulsing periods and times for the ALD sequences may be selected along with the number of sequences n and p to form an engineered barium titanium oxide film.

The thickness of a barium titanium oxide layer formed by atomic layer deposition may be determined by a fixed growth rate for the pulsing periods and precursors used, set at a value such as N nm/cycle, dependent upon the number of cycles of the barium/titanium sequences. Once an ALD cycle is determined, a growth rate per cycle may be determined. As can be understood by those skilled in the art, particular growth rates can be determined during normal initial testing of the ALD system for processing a barium titanium oxide dielectric film for a given application without undue experimentation. For a desired barium titanium oxide layer thickness, t, in an application, the ALD process is repeated for t/N total cycles. Once the t/N cycles have completed, no further ALD processing for the barium titanium oxide layer may be required. After repeating a number of ALD cycles, a determination may be made as to whether the number of barium/titanium cycles equals a predetermined number to form the desired barium titanium oxide layer. If the total number of cycles to form the desired thickness has not been completed, a number of cycles of the barium and titanium sequences may be repeated.

In an embodiment, to form strontium titanium oxide by atomic layer deposition, a strontium-containing precursor is pulsed onto a substrate in an ALD reaction chamber. A number of precursors containing strontium may be used to provide the strontium to a substrate. In an embodiment, a precursor containing strontium may include strontium bis(triisopropylcyclopentadienyl $[Sr(C_5\text{-}i\text{-}Pr_3H_2)$ where $Pr=CH_2CH_2CH_3]$. Water vapor may be used as an oxygen reactant precursor in an ALD sequence with $Sr(C_5\text{-}i\text{-}Pr_3H_2)$. In an embodiment, the substrate temperature may be maintained at a temperature of about 275° C. A titanium-containing precursor is used in a titanium sequence and may be pulsed to the substrate after the barium sequence. A number of precursors containing titanium may be used to provide the titanium to the substrate. In an embodiment, a titanium precursor pulsed may be titanium tetraisopropoxide, also written as $Ti(O^i\text{---}Pr)_4$. In an embodiment, during formation of a $SrTiO_z$ film, the substrate may be maintained at a temperature of about 325° C. In an embodiment, the substrate temperature may be maintained at a temperature ranging from less than 250° C. to about 325° C. Other titanium precursors that may be used in an ALD process include titanium halides, such as $TiCl_4$ or $TiI_4$, and $Ti(NO_3)_4$. In an embodiment, during formation of a $SrTiO_z$ film, the substrate may be maintained at a temperature of about 325° C. In an embodiment, during formation of a $SrTiO_z$ film, the substrate may be maintained at a temperature ranging from about 250° C. to about 500° C. Use of the individual precursors is not limited to the temperature ranges of the above embodiments. Further, forming strontium titanium oxide by atomic layer deposition is not limited to the abovementioned precursors. In various embodiments for ALD formation of $SrTiO_z$, the reactant precursor used in the different sequences may be an oxygen reactant precursor including, but not limited to, one or more of water vapor, atomic oxygen, molecular oxygen, ozone, hydrogen peroxide, a water-hydrogen peroxide mixture, alcohol, or nitrous oxide. In addition, the pulsing of the individual precursors in a sequence may use a pulsing period that provides uniform coverage of a monolayer on the surface or may use a pulsing period that provides partial coverage of a monolayer on the surface during a given sequence.

Embodiments for forming a $SrTiO_z$ film by atomic layer deposition may include numerous permutations of strontium sequences and titanium sequences for forming the $SrTiO_z$ film. In an embodiment, a titanium sequence is conducted before a strontium sequence. In an embodiment, a strontium sequence is conducted before a titanium sequence. In an embodiment, a strontium/titanium cycle may include a number, m, of strontium sequences, and a number, q, of titanium sequences. The number of sequences m and q may be selected to engineer the relative amounts of titanium to strontium. The permittivity of the formed $SrTiO_y$ film may be engineered based on the ratio of strontium sequences to titanium sequences. In an embodiment, associated pulsing periods and times for the ALD sequences may be selected along with the number of sequences m and q to form an engineered strontium titanium oxide film.

The thickness of a strontium titanium oxide layer formed by atomic layer deposition may be determined by a fixed growth rate for the pulsing periods and precursors used, set at a value such as M nm/cycle, dependent upon the number of cycles of the strontium/titanium sequences. Once an ALD cycle is determined, a growth rate per cycle may be determined. As can be understood by those skilled in the art, particular growth rates can be determined during normal initial testing of the ALD system for processing a strontium titanium oxide dielectric film for a given application without undue experimentation. For a desired strontium titanium oxide layer thickness, d, in an application, the ALD process is repeated for d/M total cycles. Once the d/M cycles have completed, no further ALD processing for the strontium titanium oxide layer may be required. After repeating a number of ALD cycles, a determination may be made as to whether the number of strontium/titanium cycles equals a predetermined number to form the desired strontium titanium oxide layer. If the total number of cycles to form the desired thickness has not been completed, a number of cycles of the strontium and titanium sequences may be repeated.

Layers of atomic layer deposited $SrTiO_z$ and layers of atomic layer deposited $BaTiO_y$ may be annealed to form a layer of $BaSrTiO_x$. In an embodiment, alternating layers of ALD $BaTiO_y$ and ALD $SrTiO_z$ may be annealed to form a layer of $BaSrTiO_x$. A layer of $BaSrTiO_x$ may be engineered to have a selected amount of barium, strontium, and titanium using a number of different criteria. Such criteria may include selecting the number $SrTiO_z$ layers relative to the number of $BaTiO_y$ layers and selecting the thickness of the $SrTiO_z$ layers relative to the thickness of $BaTiO_y$ layers. Various permutations of the thickness of the $SrTiO_z$ layers and various permutations of the thickness of the $BaTiO_y$ layers may be used to form the layer of $BaSrTiO_x$. Within each layer of $SrTiO_z$ the ratio of Sr to Ti may be regulated. Within each layer of $BaTiO_y$, the ratio of Ba to Ti may be regulated. Using these various criteria a layer of $BaSrTiO_x$ may be engineered with a desired dielectric constant. In an embodiment, a layer of $BaSrTiO_x$ may have a permittivity in range from 165 to 180. In various embodiments, a layer of $BaSrTiO_x$ formed using atomic layer deposition may be doped with appropriate elements. Doping may be realized by a number of different processes including ion implantation. In an embodiment, a layer of $BaSrTiO_x$ is doped with erbium.

Alternatively, in an embodiment, a BaSrTiO film may be grown to a desired thickness by repetition of a process including atomic layer deposition of layers of $BaO_u$, $SrO_v$, $TiO_r$, followed by annealing. In an embodiment, a base thickness may be formed according to various embodiments such that forming a predetermined thickness of a BaSrTiO film may be conducted by forming a number of layers having the base thickness. As can be understood by one skilled in the art, determining the base thickness depends on the application and can be determined during initial processing without undue experimentation. Relative amounts of barium, strontium, and titanium in a BaSrTiO film may be controlled by regulating the relative thicknesses of the individual layers of $BaO_x$, $SrO_y$, $TiO_z$ formed. In addition, relative amounts of barium, strontium, and titanium in a BaSrTiO film may be controlled by forming a layer of BaSrTiO as multiple layers of different base thickness and by regulating the relative thicknesses of the individual layers of $BaO_u$, $SrO_v$, $TiO_r$, formed in each base layer. In various embodiments, a layer of BaSrTiO formed using atomic layer deposition may be doped with appropriate elements. Doping may be realized by a number of different processes including ion implantation. In an embodiment, a BaSrTiO layer is doped with erbium.

In an alternative embodiment, an ALD cycle for forming BaSrTiO may include sequencing metal-containing precursors in the order of barium, strontium, and titanium in which partial coverage of a monolayer on a substrate surface is attained for pulsing of a metal-containing precursor. Embodiments for forming barium strontium titanium oxide film by atomic layer deposition may include numerous permutations of barium sequences, strontium sequences, and titanium sequences for forming a barium strontium titanium oxide film. In an embodiment, a barium/strontium/titanium cycle may include a number, nx, of barium sequences, a number, ny, of strontium sequences, and a number, nz, of titanium sequences, in which reactant precursors associated with each metal are applied with the associated sequence. The number of sequences nx, ny, and nz may be selected to engineer the relative amounts of barium, strontium, and titanium. In an embodiment, the number of sequences nx, ny, and nz are selected to form a barium-rich barium strontium titanium oxide. Alternatively, the number of sequences nx, ny, and nz are selected to form a strontium-rich barium strontium titanium oxide. Additionally, the number of sequences nx, ny, and nz are selected to form a titanium-rich barium strontium titanium oxide.

After repeating a selected number of ALD cycles, a determination may be made as to whether the number of barium/ strontium/titanium cycles equals a predetermined number to form the desired barium strontium titanium oxide layer. If the total number of cycles to form the desired thickness has not been completed, a number of cycles for the barium, strontium, and titanium sequences is repeated. The thickness of a barium strontium titanium oxide layer formed by atomic layer deposition may be determined by a fixed growth rate for the pulsing periods and precursors used, dependent upon the number of cycles of the barium/strontium/titanium sequences. Depending on the precursors used for ALD formation of a BaSrTiO film, the process may be conducted in an ALD window, which is a range of temperatures in which the growth rate is substantially constant. If such an ALD window is not available, the ALD process may be conducted at the same set of temperatures for each ALD sequence in the process. A barium strontium titanium oxide layer processed at relatively low temperatures associated with atomic layer deposition may provide an amorphous layer.

In an embodiment, a layer of $BaSrTiO_x$ doped with erbium may be constructed by forming layers of erbium oxide by atomic layer deposition interspersed among layers of barium titanium oxide that are formed by atomic layer deposition and layers of strontium titanium oxide that are formed by atomic layer deposition. In an embodiment, to form erbium oxide by atomic layer deposition, an erbium-containing precursor is pulsed onto a substrate in an ALD reaction chamber. A number of precursors containing erbium may be used to provide the erbium to a substrate. In an embodiment, a precursor containing erbium may include $Er(thd)_3$. Ozone may be used as an oxygen reactant precursor in an ALD sequence with $Er(thd)_3$. In an embodiment, during formation of an $ErO_w$ film, the substrate may be maintained at a temperature ranging from about 250° C. to about 450° C. Below 325° C. an erbium oxide film may be amorphous. Polycrystalline erbium oxide films may be grown at higher temperatures with orientation changing from (4 0 0) to (2 2 2) at deposition temperatures above 325° C. Use of the individual precursors is not limited to the temperature ranges of the above embodiments. In various embodiments for ALD formation of $ErO_w$ using different erbium-containing precursors, the reactant precursor used in the different sequences may be an oxygen reactant precursor including, but not limited to, one or more of water vapor, atomic oxygen, molecular oxygen, ozone, hydrogen peroxide, a water-hydrogen peroxide mixture, alcohol, or nitrous oxide. In various embodiments, forming erbium oxide by atomic layer deposition is not limited to the abovementioned precursor and use of individual erbium-containing precursors is not limited to the temperature ranges of the above example embodiment. In addition, the pulsing of the individual precursors in a sequence may use a pulsing period that provides uniform coverage of a monolayer on the surface or may use a pulsing period that provides partial coverage of a monolayer on the surface during an erbium sequence.

In an embodiment, a number of $ErO_w$ layers, a number of $BaTiO_y$ layers, and a number of $SrTiO_z$ layers may be formed by atomic layer deposition, where the number of $ErO_w$ layers is selected to be significantly less than the number of $BaTiO_y$ layers and the number of $SrTiO_z$ layers. The $ErO_w$ layers, $BaTiO_y$ layers, and $SrTiO_z$ layers may be annealed to form Er-doped $BaSrTiO_x$. In an embodiment, a laminate structure of alternating layers of ALD $SrTiO_3$ and ALD $BaTiO_3$, interspersed with ALD $Er_2O_3$ layers are annealed to produce an Er-doped $Ba_{0.7}Sr_{0.3}TiO_3$ film. In an embodiment, the number of $ErO_w$ layers is selected such that the percentage of $ErO_w$ in the total number of $ErO_w$ layers, $BaTiO_y$ layers, and $SrTiO_z$ layers is less than or equal to 10%. In an embodiment, the number of $ErO_w$ layers is selected such that the atomic concentration of erbium in the formed Er-doped $BaSrTiO_x$ is less than or equal to 10%. In an embodiment, the number of $ErO_w$ layers may be interspersed among the number of $ErO_w$ layers in a predetermined arrangement prior to annealing. In an embodiment, the number of $ErO_w$ layers may be interspersed among the number of $BaTiO_y$ layers and $SrTiO_z$ layers in a random order prior to annealing. In various embodiments, the order of forming $BaTiO_y$, $SrTiO_z$, and $ErO_w$ layers may be permutated. The annealing may be conducted in a nitrogen ambient. In an embodiment, annealing may be conducted in a nitrogen ambient having a small amount of oxygen. However, annealing is not limited to these ambient conditions. The annealing may be performed at about 600° C. or higher. The annealing may be conducted for about 60 minutes or less. In an embodiment, annealing is conducted for less than one minute. The annealing may be performed at other temperatures and with other annealing times. The annealing temperatures and annealing time periods may be selected based on the desired structure for the Er-doped $BaSrTiO_x$ layer.

In an embodiment, layers of $BaTiO_y$, layers of $SrTiO_z$, and layers of $ErO_w$ are each grown by atomic layer deposition to a thickness such that annealing these layers at appropriate temperatures essentially converts these layers to a layer of Er-doped $BaSrTiO_x$. In an embodiment, an Er-doped $BaSrTiO_x$ film may be grown to a desired thickness by repetition of a process including atomic layer deposition of $BaTiO_y$, layers of $SrTiO_z$, and layers of $ErO_w$ followed by annealing. In an embodiment, a base thickness may be formed according to various embodiments such that forming a predetermined thickness of an Er-doped $BaSrTiO_x$ film may be conducted by forming a number of layers having the base thickness. As can be understood by one skilled in the art, determining the base thickness depends on the application and can be determined during initial processing without undue experimentation. Relative amounts of erbium, barium, strontium, titanium, and oxygen in an Er-doped $BaSrTiO_x$ film may be controlled by regulating the relative thicknesses of the individual layers of oxides formed. In addition, relative amounts of erbium, barium, strontium, titanium, and oxygen in a Er-doped $BaSrTiO_x$ film may be controlled by forming a layer of Er-doped $BaSrTiO_x$ as multiple layers of different base thickness and by regulating the relative thicknesses of the individual layers of oxides formed in each base layer prior to annealing. As can be understood by those skilled in the art, particular effective growth rates for the engineered Er-doped $BaSrTiO_x$ film can be determined during normal initial testing of the ALD system used for a given application without undue experimentation.

In an alternative embodiment, an ALD cycle for forming Er-doped BaSrTiO may include repetitive sequencing of metal-containing precursors of barium, strontium, and titanium, in which an erbium sequence is substituted for one or more of the main sequences or one or more erbium sequences is added to the main sequences of a ALD cycle in which partial coverage of a monolayer on a substrate surface is attained for pulsing of a metal-containing precursor. Embodiments for forming erbium-doped barium strontium titanium oxide film by atomic layer deposition may include numerous permutations of erbium sequences interspersed among the main barium sequences, strontium sequences, and titanium sequences in an ALD cycle. In an embodiment, a barium/strontium/titanium/erbium cycle may include a number, mx, of barium sequences, a number, my, of strontium sequences, a number, mz, of titanium sequences, and a number, mr, of erbium sequences, in which reactant precursors associated with each metal are applied with the associated sequence. The number of sequences mx, my, mz, and mr may be selected to engineer the relative amounts of barium, strontium, titanium, and erbium. In an embodiment, the number of sequences mx, my, mz and mr are selected to form a barium-rich erbium-doped barium strontium titanium oxide. Alternatively, the number of sequences mx, my, mz and mr are selected to form a strontium-rich erbium-doped barium strontium titanium oxide. Additionally, the number of sequences mx, my, mz and mr are selected to form a titanium-rich erbium-doped barium strontium titanium oxide. The number of sequences mx, my, mz and mr may be chosen to limit the amount of erbium doped in a BaSrTiO$_x$ film.

After repeating a selected number of ALD cycles, a determination may be made as to whether the number of barium/strontium/titanium/erbium cycles equals a predetermined number to form the desired erbium-doped barium strontium titanium oxide layer. If the total number of cycles to form the desired thickness has not been completed, a number of cycles for the barium, strontium, titanium, and erbium sequences is repeated. The thickness of an erbium-doped barium strontium titanium oxide layer formed by atomic layer deposition may be determined by a fixed growth rate for the pulsing periods and precursors used, set at a value such as P nm/cycle, dependent upon the number of cycles of the barium/strontium/titanium/erbium sequences. Depending on the precursors used for ALD formation of a BaSrTiO film, the process may be conducted in an ALD window. If such an ALD window is not available, the ALD process may be conducted at the same set of temperatures for each ALD sequence in the process. For a desired erbium-doped barium strontium titanium oxide layer thickness, l, in an application, the ALD process is repeated for l/P total cycles. Once the l/P cycles have been completed, no further ALD processing for the erbium-doped barium strontium titanium oxide layer is required. An erbium-doped barium strontium titanium oxide layer processed at relatively low temperatures associated with atomic layer deposition may provide an amorphous layer.

In various embodiments, nitrogen may be used as a purging gas and a carrier gas for one or more of the sequences for forming BaO$_u$, SrO$_v$, TiO$_r$, BaTiO$_y$, SrTiO$_z$, ErO$_w$, and BaSrTiO$_x$. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

Atomic layer deposition of the individual components or layers allows for individual control of each precursor pulsed into the reaction chamber. Thus, each precursor is pulsed into the reaction chamber for a predetermined period, where the predetermined period can be set separately for each precursor. Additionally, for various ALD formations, each precursor may be pulsed into the reaction chamber under separate environmental conditions. The substrate may be maintained at a selected temperature and the reaction chamber maintained at a selected pressure independently for pulsing each precursor. Appropriate temperatures and pressures may be maintained, whether the precursor is a single precursor or a mixture of precursors.

Either before or after forming a BaSrTiO film in accordance with any embodiment, other dielectric layers such as nitride layers, dielectric metal silicates, insulating metal oxides, or combinations thereof may be formed as part of a dielectric layer or dielectric stack. These one or more other layers of dielectric material may be provided in stoichiometric form, in non-stoichiometric form, or a combination thereof. Depending on the application, a dielectric stack containing a BaSrTiO$_x$ film may include a silicon oxide layer. In an embodiment, the dielectric layer may be formed as a nanolaminate. Alternatively, a dielectric layer may be formed substantially as a barium strontium titanium oxide film or as an erbium-doped barium strontium titanium oxide film.

In various embodiments, the structure of an interface between a dielectric layer and a substrate on which it is disposed is controlled to limit the inclusion of a native oxide. A native oxide, such as a silicon oxide layer on silicon, would reduce the effective dielectric constant of the dielectric layer. The material composition and properties for an interface layer may be dependent on process conditions and the condition of the substrate before forming the dielectric layer. Though the existence of an interface layer may effectively reduce the dielectric constant associated with the dielectric layer and its substrate, the interface layer, such as a silicon oxide interface layer or other material interface layer, may improve the interface density, fixed charge density, and channel mobility of a device having this interface layer.

FIG. 1 shows an embodiment of a transistor 100 having a dielectric layer 140 containing a BaSrTiO$_x$ film. The BaSrTiO$_x$ film may be doped with erbium. Transistor 100 may include a source region 120 and a drain region 130 in a silicon-based substrate 110, where source and drain regions 120, 130 are separated by a body region 132. Body region 132 defines a channel having a channel length 134. A gate dielectric 140 may be disposed on substrate 110 with gate dielectric 140 formed as a dielectric layer containing BaSrTiO$_x$. Gate dielectric 140 may be realized as a dielectric layer formed substantially of BaSrTiO$_x$. Gate dielectric 140 may be constructed as multiple dielectric layers, that is, as a dielectric stack, containing at least one BaSrTiO$_x$ film and one or more layers of insulating material other than a barium strontium titanium oxide film. The BaSrTiO$_x$ film may be structured as one or more monolayers. An embodiment of a BaSrTiO$_x$ film or an Er-doped BaSrTiO$_x$ film may be formed using atomic layer deposition. A gate 150 may be formed over and contact gate dielectric 140.

An interfacial layer 133 may form between body region 132 and gate dielectric 140. In an embodiment, interfacial layer 133 may be limited to a relatively small thickness compared to gate dielectric 140, or to a thickness significantly less than gate dielectric 140 as to be effectively eliminated. Forming the substrate and the source and drain regions may be performed using standard processes known to those skilled in the art. Additionally, the sequencing of the various elements of the process for forming a transistor may be conducted with fabrication processes known to those skilled in the art. In an embodiment, gate dielectric 140 may be realized as a gate insulator in a silicon complimentary metal oxide semiconductor (CMOS) transistor. Use of a gate dielectric containing a barium strontium titanium oxide film, an erbium-doped barium strontium titanium oxide film, or a combination thereof is not limited to silicon based substrates, but may be used with a variety of semiconductor substrates.

Figure 2:
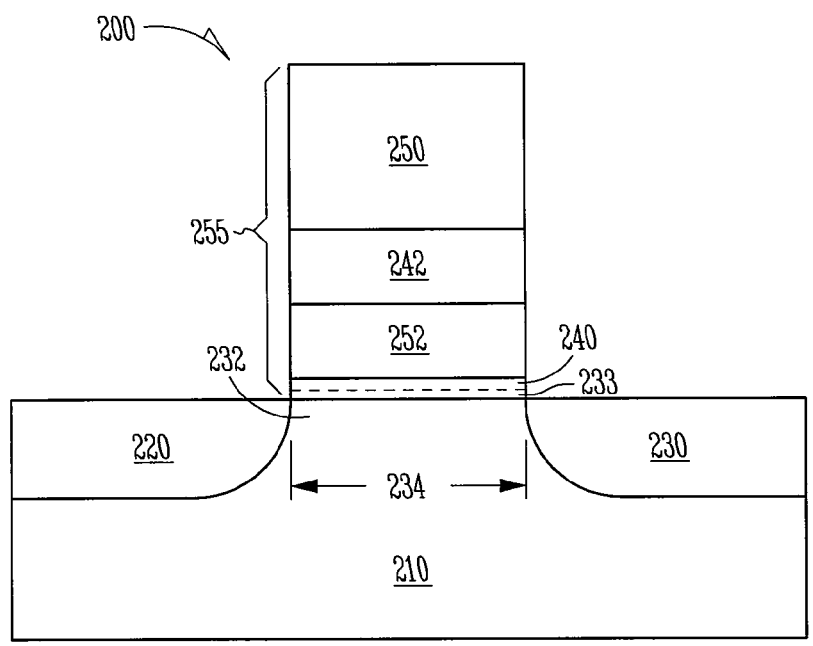
FIG. 2 shows a representation of an embodiment of a floating gate transistor having a dielectric layer containing a barium strontium titanium oxide film, an erbium-doped barium strontium titanium oxide film, or a combination thereof.

FIG. 2 shows an embodiment of a floating gate transistor 200 having a dielectric layer containing BaSrTiO$_x$ film. The BaSrTiO$_x$ film may be doped with erbium. The BaSrTiO$_x$ film may be structured as one or more monolayers. The BaSrTiO$_x$ film or Er-doped BaSrTiO$_x$ film may be formed using atomic layer deposition techniques. Transistor 200 may include a silicon-based substrate 210 with a source 220 and a drain 230 separated by a body region 232. Body region 232 between source 220 and drain 230 defines a channel region having a channel length 234. Located above body region 232 is a stack 255 including a gate dielectric 240, a floating gate 252, a floating gate dielectric 242, and a control gate 250. An interfacial layer 233 may form between body region 232 and gate dielectric 240. In an embodiment, interfacial layer 233 may be limited to a relatively small thickness compared to gate dielectric 240, or to a thickness significantly less than gate dielectric 240 as to be effectively eliminated.

In an embodiment, gate dielectric 240 includes a dielectric containing an atomic layer deposited $BaSrTiO_x$ film. Gate dielectric 240 may be realized as a dielectric layer formed substantially of $BaSrTiO_x$. Gate dielectric 240 may be a dielectric stack containing at least one $BaSrTiO_x$ film or Er-doped $BaSrTiO_x$ film and one or more layers of other insulating materials. In an embodiment, floating gate 252 may be formed over and contact gate dielectric 240.

In an embodiment, floating gate dielectric 242 includes a dielectric containing a $BaSrTiO_x$ film. The $BaSrTiO_x$ film may be doped with erbium. The $BaSrTiO_x$ film may be structured as one or more monolayers. In an embodiment, the $BaSrTiO_x$ film or the Er-doped $BaSrTiO_x$ film may be formed using atomic layer deposition techniques. Floating gate dielectric 242 may be realized as a dielectric layer formed substantially of $BaSrTiO_x$. Floating gate dielectric 242 may be a dielectric stack containing at least one $BaSrTiO_x$ film and one or more layers of other insulating materials. In an embodiment, control gate 250 may be formed over and contact floating gate dielectric 242.

Alternatively, both gate dielectric 240 and floating gate dielectric 242 may be formed as dielectric layers containing a $BaSrTiO_x$ film structured as one or more monolayers. The $BaSrTiO_x$ film may be doped with erbium. Gate dielectric 240 and floating gate dielectric 242 may be realized by embodiments similar to those described herein, with the remaining elements of the transistor 200 formed using processes known to those skilled in the art. In an embodiment, gate dielectric 240 forms a tunnel gate insulator and floating gate dielectric 242 forms an inter-gate insulator in flash memory devices, where gate dielectric 240 and floating gate dielectric 242 may include a erbium-doped barium strontium titanium oxide film, an erbium-doped barium strontium titanium oxide film, or combination thereof structured as one or more monolayers. Such structures are not limited to silicon based substrates, but may be used with a variety of semiconductor substrates.

Figure 3:
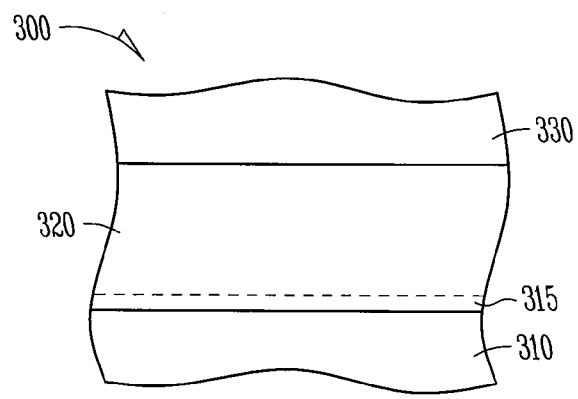
FIG. 3 shows a representation of an embodiment of a capacitor having a dielectric layer containing a barium strontium titanium oxide film, an erbium-doped barium strontium titanium oxide film, or a combination thereof.

Embodiments of a barium strontium titanium oxide film, an erbium-doped barium strontium titanium oxide film, or combinations thereof structured as one or more monolayers may also be applied to capacitors in various integrated circuits, memory devices, and electronic systems. In an embodiment for a capacitor 300 illustrated in FIG. 3, a method includes forming a first conductive layer 310, forming a dielectric layer 320 containing a barium strontium titanium oxide film structured as one or more monolayers on first conductive layer 310, and forming a second conductive layer 330 on dielectric layer 320. The $BaSrTiO_x$ film may be doped with erbium. Dielectric layer 320 may be a dielectric stack containing at least one $BaSrTiO_x$ film or Er-doped $BaSrTiO_x$ film and one or more layers of other insulating materials. An interfacial layer 315 may form between first conductive layer 310 and dielectric layer 320. In an embodiment, interfacial layer 315 may be limited to a relatively small thickness compared to dielectric layer 320, or to a thickness significantly less than dielectric layer 320 as to be effectively eliminated.

Embodiments for a barium strontium titanium oxide film, an erbium-doped barium strontium titanium oxide film, or a combination thereof structured as one or more monolayers may include, but are not limited to, a capacitor in a DRAM and capacitors in analog, radio frequency (RF), and mixed signal integrated circuits. Mixed signal integrated circuits are integrated circuits that may operate with digital and analog signals.

Figure 4:
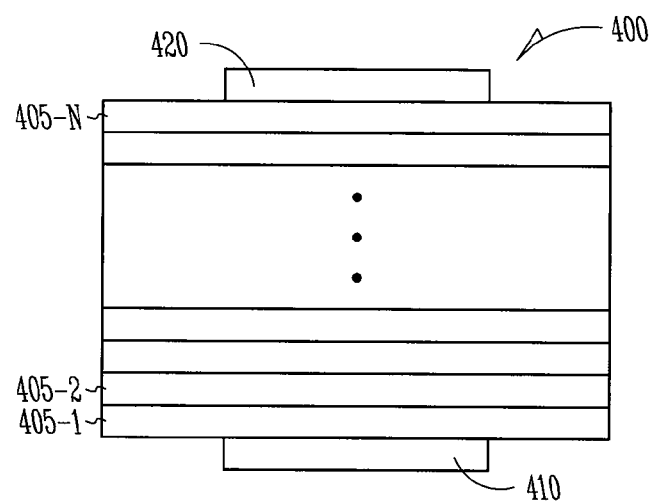
FIG. 4 depicts a representation of an embodiment of a dielectric layer having multiple layers including a barium strontium titanium oxide layer, an erbium-doped barium strontium titanium oxide layer, or a combination thereof.

FIG. 4 depicts an embodiment of a dielectric structure 400 having multiple dielectric layers 405-1, 405-2, . . . 405-N, in which at least one layer is a barium strontium titanium oxide layer. The $BaSrTiO_x$ film may be doped with erbium. Layers 410 and 420 may provide means to contact dielectric layers 405-1, 405-2, . . . 405-N. Layers 410 and 420 may be electrodes forming a capacitor. Layer 410 may be a body region of a transistor with layer 420 being a gate. Layer 410 may be a floating gate electrode with layer 420 being a control gate.

In an embodiment, dielectric structure 400 includes one or more layers 405-1, 405-2 . . . 405-N as dielectric layers other than a BaSrTiO layer, where at least one layer is a BaSrTiO layer. The $BaSrTiO_x$ film may be doped with erbium. Dielectric layers 405-1, 405-2 . . . 405-N may include an insulating metal oxide layer. Dielectric layers 405-1, 405-2, . . . 405-N may include an insulating nitride layer. Dielectric layers 405-1, 405-2, . . . 405-N may include an insulating oxynitride layer. Dielectric layers 405-1, 405-2, . . . 405-N may include a silicon nitride layer. Dielectric layers 405-1, 405-2, . . . 405-N may include an insulating silicate layer. Dielectric layers 405-1, 405-2, . . . 405-N may include a silicon oxide layer.

Various embodiments for a dielectric layer containing a barium strontium titanium oxide film, an erbium-doped barium strontium titanium oxide film, or a combination thereof structured as one or more monolayers may provide for enhanced device performance by providing devices with reduced leakage current. Such improvements in leakage current characteristics may be attained by forming one or more layers of a barium strontium titanium oxide in a nanolaminate structure with other metal oxides, non-metal-containing dielectrics, or combinations thereof. One or more layers of $BaSrTiO_x$ may be doped with erbium. The transition from one layer of the nanolaminate to another layer of the nanolaminate provides disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers.

In an embodiment, dielectric structure 400 may be structured as a nanolaminate structure 400 including a $BaSrTiO_x$ film structured as one or more monolayers. The $BaSrTiO_x$ film may be doped with erbium. Nanolaminate structure 400 includes a plurality of layers 405-1, 405-2 to 405-N, where at least one layer contains a $BaSrTiO_x$ film structured as one or more monolayers. The other layers may be insulating nitrides, insulating oxynitrides, and other dielectric materials such as insulating metal oxides. The sequencing of the layers depends on the application. The effective dielectric constant associated with nanolaminate structure 400 is that attributable to N capacitors in series, where each capacitor has a thickness defined by the thickness and composition of the corresponding layer. By selecting each thickness and the composition of each layer, a nanolaminate structure can be engineered to have a predetermined dielectric constant. Embodiments for structures such as nanolaminate structure 400 may be used as nanolaminate dielectrics in non-volatile read only memory (NROM) flash memory devices as well as other integrated circuits. In an embodiment, a layer of the nanolaminate structure 400 is used to store charge in a NROM device. The charge storage layer of a nanolaminate structure 400 in a NROM device may be a silicon oxide layer.

Rare-earth doped materials have various applications in optoelectronic devices and displays based on the luminescent properties of these materials. Application of erbium-doped oxides may be directed to use of its characteristic emission at 1.54 µm. The 1.54 µm wavelength also corresponds to a minimum loss in silica based fiber. Additionally, devices may take advantage of $Er^{+3}$ transitions in the blue, green, and red spectral regions. The energy of transitions for erbium doped materials is relatively independent of its host matrix and ambient temperature, though the host matrix affects the relative intensity of photoluminescence, chemical stability, and sensitivity to the operational environment. With respect to typical sulfide luminescent phosphors, oxide film phosphors provide atmospheric stability, anticorrosive properties, and reduced degradation under applied voltages. In various embodiments, ALD Er-doped $BaSrTiO_x$ may be used in place of luminescent phosphors in optoelectronic devices. $Er^{+3}$ ions may be incorporated into barium strontium titanate to form an extended solution using atomic layer deposition. ALD Er-doped $Ba_{0.7}Sr_{0.3}TiO_3$ films may be used in electroluminescent devices, such as displays and flat panel displays, and in place of luminescent phosphors in optoelectronic devices.

Figure 5:
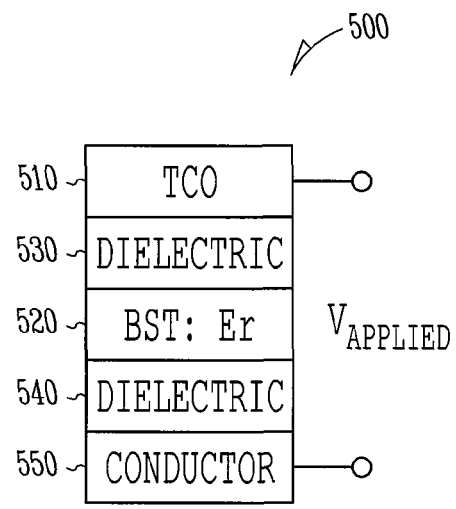
FIG. 5 illustrates a representation of an embodiment of a flat panel display having an erbium-doped barium strontium titanium oxide film.

FIG. 5 illustrates a representation of an embodiment of a flat panel display 500 having an erbium-doped barium strontium titanium oxide film 520. Flat panel display 500 may include BST:Er film 520 separated by a dielectric layer 530 from a transparent conductive oxide (TCO) layer 510 and separated by a dielectric layer 540 from a conductive layer 550. Conductive layer 550 may be a metal layer. TCO layer 510 and conductive layer 550 are configured to contact an appropriate voltage source, which enables a voltage, $V_{APPLIED}$, to be applied between TCO layer 510 and conductive layer 550. Various types or configurations of voltage sources may be used to provide $V_{APPLIED}$. Other configurations for a flat panel display or other displays having an erbium-doped barium strontium titanium oxide film may be used.

Figure 6:
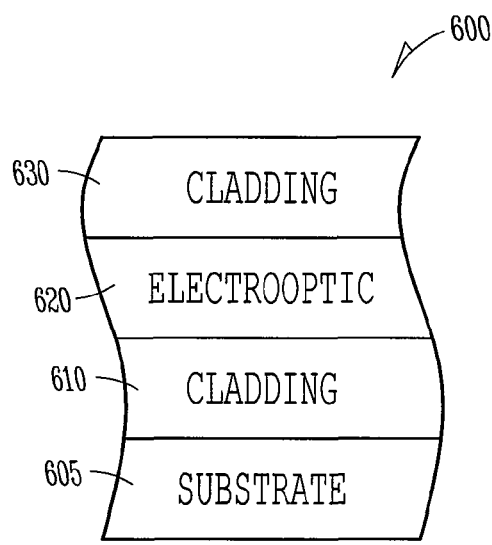
FIG. 6 depicts a representation of an embodiment of an optoelectronic apparatus having an electrooptic region that includes a barium strontium titanium oxide layer, an erbium-doped barium strontium titanium oxide layer, or a combination thereof.

FIG. 6 depicts a representation of an embodiment of an optoelectronic apparatus 600 having an electrooptic region 620 that includes an ALD BST film, an ALD BST:Er film, or a combination thereof. In an embodiment, optoelectronic apparatus 600 includes a substrate 605, a bottom cladding layer 610, a top cladding layer 630, and layer 620 of electrooptic material between bottom cladding layer 610 and a top cladding layer 630. Layer 620 of electrooptic material is an optical layer, which is used for propagation of light and/or modification of the propagation of light. Substrate 605 may be a silicon substrate, a silicon-germanium substrate, a glass substrate, a GaAs substrate, an InP substrate, or a substrate of other III-V compositions. Substrate 605 is not limited to these materials. Substrate 605 may be configured to be combined with cladding 610. Cladding material may include silicon oxide or other appropriate dielectric material. Electrodes may be provided to modulate optoelectronic apparatus 600 to utilize the optical-related properties of electrooptic material 620. The electrodes may be connected to TCO layers disposed on the top and bottom of electrooptic material 620. The electrodes may be connected in other configurations that do not interfere with the optical operation of optoelectronic apparatus 600. The materials selected for substrate 605, cladding layer 610, cladding layer 630, and electrooptic material layer 620 may be chosen based on the characteristics of the application, such as the wavelengths of interest. Optoelectronic apparatus 600 may be structured as an integrated optic device. Optoelectronic apparatus 600 may be configured in a variety of devices and systems.

Transistors, capacitors, displays, waveguide structures, and other electronic and optoelectronic devices may include dielectric films containing a layer of a barium strontium titanium oxide film, an erbium-doped barium strontium titanium oxide film, or a combination thereof structured as one or more monolayers. The erbium-doped barium strontium titanium oxide layer may be formed by atomic layer deposition. Dielectric films containing a barium strontium titanium oxide layer, an erbium-doped barium strontium titanium oxide layer, or a combination thereof may be implemented into memory devices and electronic systems including information handling devices. Barium strontium titanium oxide layers may be structured to provide high permittivity and low leakage currents in electronic devices. Further, embodiments of electronic devices and optoelectronic apparatus may be realized as integrated circuits. Embodiments of information handling devices may include wireless systems, telecommunication systems, and computers.

Figure 7:
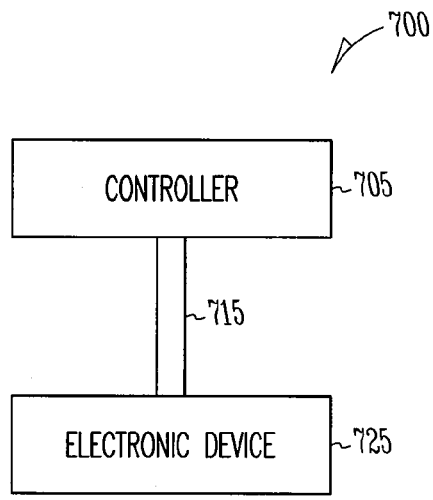
FIG. 7 depicts a representation of a simplified diagram for an embodiment of a controller coupled to an electronic device having a dielectric layer containing a barium strontium titanium oxide layer, an erbium-doped barium strontium titanium oxide layer, or a combination thereof.

FIG. 7 illustrates a block diagram for an electronic system 700 having one or more devices having a dielectric structure including a barium strontium titanium oxide film, an erbium-doped barium strontium titanium oxide film, or a combination thereof structured as one or more monolayers. The thickness of such a $BaSrTiO_x$ layer may range from a monolayer to thousands of angstroms or more, and may be processed using atomic layer deposition. Electronic system 700 includes a controller 705, a bus 715, and an electronic device 725, where bus 715 provides electrical conductivity between controller 705 and electronic device 725. Electronic device 725 may be an optoelectronic device. In various embodiments, controller 705 may include an embodiment of a $BaSrTiO_x$ film. The $BaSrTiO_x$ film may be doped with erbium. In various embodiments, electronic device 725 may include an embodiment of a $BaSrTiO_x$ film. The $BaSrTiO_x$ film may be doped with erbium. In various embodiments, controller 705 and electronic device 725 may include embodiments of a $BaSrTiO_x$ film. The $BaSrTiO_x$ film may be doped with erbium. Electronic system 700 may include, but is not limited to, fiber optic systems, electro-optic systems, and information handling systems such as wireless systems, telecommunication systems, and computers.

Figure 8:
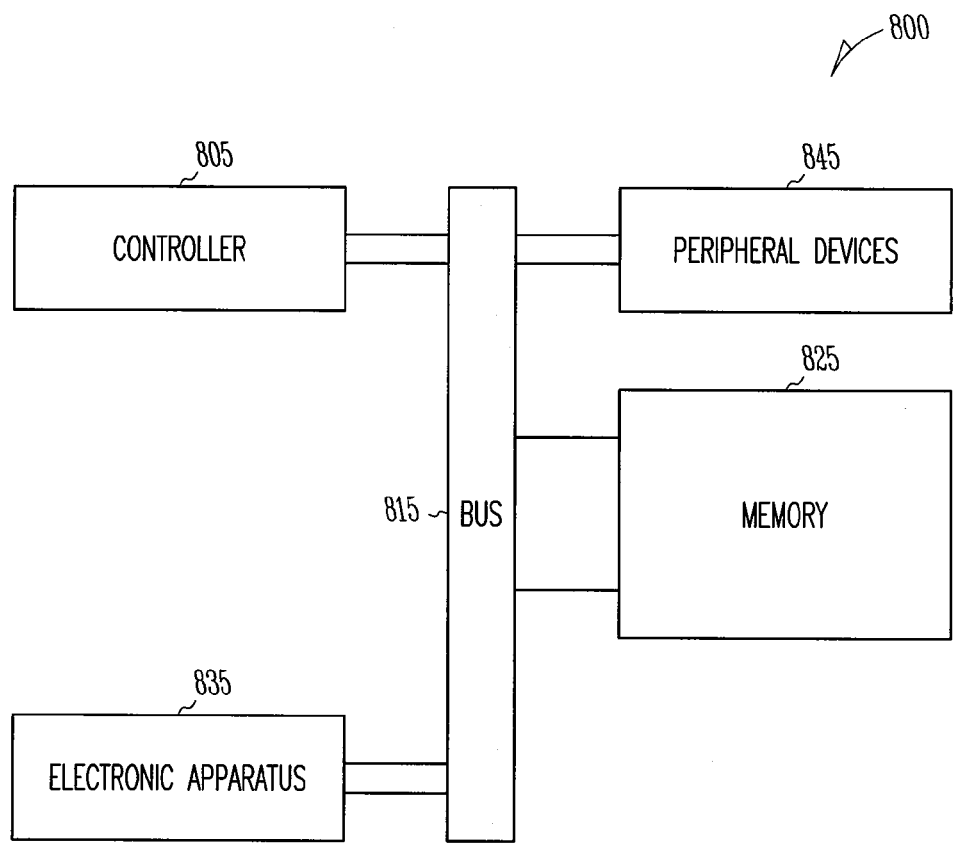
FIG. 8 illustrates a representation of a block diagram for an embodiment of an electronic system having devices with a dielectric film containing a barium strontium titanium oxide layer, an erbium-doped barium strontium titanium oxide layer, or a combination thereof.

FIG. 8 depicts a diagram of an embodiment of a system 800 having one or more devices containing a barium strontium titanium oxide film, an erbium-doped barium strontium titanium oxide film, or a combination thereof structured as one or more monolayers. System 800 also includes a controller 805, a memory 825, an electronic apparatus 835, and a bus 815, where bus 815 provides electrical conductivity between controller 805 and electronic apparatus 835 and between controller 805 and memory 825. Bus 815 may include an address bus, a data bus, and a control bus, each independently configured. Alternatively, bus 815 may use common conductive lines for providing one or more of address, data, or control, the use of which is regulated by controller 805. In an embodiment, apparatus 835 may be additional memory configured in a manner similar to memory 825. In an embodiment, system 800 may include an additional peripheral device or devices 845 coupled to bus 815. Peripheral devices 845 may include displays, additional storage memory, or other control devices that may operate in conjunction with controller 805. Alternatively, peripheral devices 845 may include displays, additional storage memory, or other control devices that may operate in conjunction with memory 825, or controller 805 and memory 825. In an embodiment, controller 805 is a processor. One or more of controller 805, memory 825, bus 815, apparatus 835, or peripheral devices 845 may include an embodiment of a dielectric layer having a barium strontium titanium oxide film, an erbium-doped barium strontium titanium oxide film, or a combination thereof structured as one or more monolayers. The thickness of such a $BaSrTiO_x$ structure may range from a monolayer to thousands of angstroms or more, and may be processed using atomic layer deposition.

Memory 825 may be realized as a memory device containing a barium strontium titanium oxide film, an erbium-doped barium strontium titanium oxide film, or a combination thereof structured as one or more monolayers. The $BaSrTiO_x$ structure may be formed in a memory cell of a memory array. The $BaSrTiO_x$ structure may be formed in a capacitor in a memory cell of a memory array. The $BaSrTiO_x$ structure may be formed in a transistor in a memory cell of a memory array. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SDRAM (Synchronous Graphics Random Access Memory), SDRAM (Synchronous Dynamic Random Access Memory), SDRAM II, and DDR SDRAM (Double Data Rate SDRAM), as well as other emerging DRAM technologies. System 800 may include, but is not limited to, fiber optic systems, electro-optic systems, and information handling systems including wireless devices, wireless systems, and computers.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. An electronic device comprising:
   a substrate; and
   a dielectric disposed on the substrate, the dielectric including a nanolaminate, the nanolaminate consisting of a plurality of insulating layers, the nanolaminate containing barium strontium titanium oxide, a layer of erbium-doped barium strontium titanium oxide being doped with a compound or an element without erbium, barium, strontium, titanium, or combinations thereof, and a layer of an insulating material in which the insulating material is structured without containing both barium and strontium, the barium strontium titanium oxide being doped with a compound or an element without erbium, barium, strontium, titanium, or combinations thereof.

2. The electronic device of claim 1, wherein the electronic device includes a capacitor having the dielectric as a capacitor dielectric.

3. The electronic device of claim 1, wherein the electronic device includes the dielectric disposed as a gate insulator in a silicon-based transistor of a CMOS device.

4. The electronic device of claim 1, wherein the electronic device includes an optoelectronic device in which the dielectric is disposed.

5. The electronic device of claim 1, wherein the electronic device includes an electroluminescent device in which the dielectric is disposed.

6. An electronic device comprising:
   a memory including a dielectric having a nanolaminate, the nanolaminate consisting of a plurality of insulating layers, the nanolaminate containing barium strontium titanium oxide, a layer of erbium-doped barium strontium titanium oxide, the erbium-doped barium strontium titanium oxide being doped with a compound or an element without erbium, barium, strontium, titanium, or combinations thereof, and a layer of an insulating material in which the insulating material is structured without containing both barium and strontium, the barium strontium titanium oxide being doped with a compound or an element without erbium, barium, strontium, titanium, or combinations thereof.

7. The electronic device of claim 6, the memory includes an array of memory cells, each memory cell containing erbium-doped barium strontium titanium oxide.

8. The electronic device of claim 6, wherein the dielectric is structured as an emissive region in the memory.

9. The electronic device of claim 6, wherein the dielectric includes one or more of an insulating metal oxide, an insulating nitride, an insulating oxynitride, silicon nitride, an insulating silicate layer, or silicon oxide.

10. The electronic device of claim 6, wherein the dielectric is disposed in a NROM flash memory.

11. An electronic device comprising:
    an array of memory cells disposed on a substrate, each memory cell includes a dielectric, the dielectric including a nanolaminate, the nanolaminate consisting of a plurality of insulating layers, the nanolaminate containing barium strontium titanium oxide, a layer of erbium-doped barium strontium titanium oxide being doped with a compound or an element without erbium, barium, strontium, titanium, or combinations thereof, and a layer of an insulating material in which the insulating material is structured without containing both barium and strontium, the barium strontium titanium oxide being doped with a compound or an element without erbium, barium, strontium, titanium, or combinations thereof.

12. The electronic device of claim 11, wherein the nanolaminate is disposed in a NROM device, the nanolaminate including silicon oxide, the silicon oxide arranged to store charge.

13. The electronic device of claim 11, wherein the nanolaminate includes an insulating metal oxide without barium strontium titanium oxide.

14. The electronic device of claim 11, wherein the memory cell includes a transistor having barium strontium titanium oxide disposed between a floating gate of the transistor and a control gate of the transistor.

15. The electronic device of claim 11, wherein the nanolaminate is disposed as a tunneling dielectric.

16. An electronic device comprising:
    a display containing erbium-doped barium strontium titanium oxide; and
    a controller or a memory coupled to the display, the controller or the memory including a dielectric having a nanolaminate, the nanolaminate consisting of a plurality of insulating layers, the nanolaminate containing barium strontium titanium oxide, a layer of erbium-doped barium strontium titanium oxide, the erbium-doped barium strontium titanium oxide being doped with a compound or an element without erbium, barium, strontium, titanium, or combinations thereof, and a layer of an insulating material in which the insulating material is structured without containing both barium and strontium, the barium strontium titanium oxide being doped with a compound or an element without erbium, barium, strontium, titanium, or combinations thereof.

17. The electronic device of claim 16, wherein the display includes a flat panel display.

18. The electronic device of claim 17, wherein the flat panel display includes a transparent conductive oxide layer separated from a conductive layer, the transparent conductive oxide layer and the conductive layer arranged to operatively apply a voltage across the erbium-doped barium strontium titanium oxide.

19. The electronic device of claim 18, wherein conductive layer includes a metal layer.

20. The electronic device of claim 18, wherein a dielectric separates the transparent conductive oxide layer from the erbium-doped barium strontium titanium oxide, and another dielectric separates the conductive layer from the erbium-doped barium strontium titanium oxide.

21. An electronic device comprising:
   a structure having a region to propagate electromagnetic radiation;
   an electrooptic region disposed in the structure, the electrooptic region including an electrooptic material containing erbium-doped barium strontium titanium oxide; and
   an electronic unit coupled to the structure, the electronic unit including a dielectric having a nanolaminate, the nanolaminate consisting of a plurality of insulating layers, the nanolaminate containing barium strontium titanium oxide, a layer of erbium-doped barium strontium titanium oxide, the erbium-doped barium strontium titanium oxide being doped with a compound or an element without erbium, barium, strontium, titanium, or combinations thereof, and a layer of an insulating material in which the insulating material is structured without containing both barium and strontium, the barium strontium titanium oxide being doped with a compound or an element without erbium, barium, strontium, titanium, or combinations thereof.

22. The electronic device of claim 21, wherein the structure includes a transparent conductive oxide arranged to operatively modulate the electrooptic material.

23. The electronic device of claim 21, wherein the structure includes two cladding layers with the electrooptic region disposed between the two cladding layers.

24. The electronic device of claim 21, wherein the structure includes a substrate such that the electrooptic region is disposed above the substrate, the substrate including material having a III-V composition.

25. The electronic device of claim 21, wherein the structure is arranged as an integrated optic device.

* * * * *

UNITED STATES PATENT AND TRADEMARK OFFICE
CERTIFICATE OF CORRECTION

| | | |
|---|---|---|
| PATENT NO. | : 8,581,352 B2 | Page 1 of 1 |
| APPLICATION NO. | : 12/550971 | |
| DATED | : November 12, 2013 | |
| INVENTOR(S) | : Kie Y. Ahn et al. | |

It is certified that error appears in the above-identified patent and that said Letters Patent is hereby corrected as shown below:

In the Claims

In column 20, line 7, in Claim 7, delete "the" and insert -- wherein the --, therefor.

Signed and Sealed this
Eleventh Day of February, 2014

Michelle K. Lee
*Deputy Director of the United States Patent and Trademark Office*